United States Patent [19]
Edel

[11] Patent Number: 6,018,700
[45] Date of Patent: Jan. 25, 2000

[54] SELF-POWERED CURRENT MONITOR

[76] Inventor: Thomas G. Edel, 9232 N. Tyler Ave., Portland, Oreg. 97203-2356

[21] Appl. No.: 09/026,474

[22] Filed: Feb. 19, 1998

[51] Int. Cl.$^7$ ....................................................... H02H 7/00
[52] U.S. Cl. .................................. 702/60; 702/64; 702/65; 361/18; 361/79
[58] Field of Search .................. 702/60–65; 364/528.28, 364/528.32, 528.33; 363/53; 361/18, 56, 118, 79

[56] References Cited

U.S. PATENT DOCUMENTS

| | | | |
|---|---|---|---|
| 4,550,360 | 10/1985 | Dougherty | 364/528.28 |
| 4,884,021 | 11/1989 | Hammond et al. | 702/61 |
| 5,315,527 | 5/1994 | Beckwith | 702/72 |
| 5,426,360 | 6/1995 | Maraio et al. | 324/127 |
| 5,579,197 | 11/1996 | Mengelt et al. | 361/18 |
| 5,590,179 | 12/1996 | Shincovich et al. | 340/870.03 |

*Primary Examiner*—Marc S. Hoff
*Assistant Examiner*—Bryan Bui

[57] ABSTRACT

A self-powered current monitor for monitoring current in electric power systems. Various data relating to input currents may be displayed, such as current magnitude, current demand, and harmonics levels. Operating power is derived from one or more of the input currents. The power supply configuration may include a burden-reducing means to reduce the burden on input current sources during sampling of the input currents. The self-powered current monitor (1) includes a power supply section (3), input resistors (R1 and R3), an analog-to-digital converter circuit (5), a microprocessor circuit (6), a memory circuit (9), and a display circuit (7). Optional features include a burden-reducing circuit (2), input circuit protective elements (D1, D2, D3, D4, R2, and R4), an amplifier circuit (4), a user interface circuit (10), and an interface circuit (8) for communication to other equipment.

41 Claims, 18 Drawing Sheets

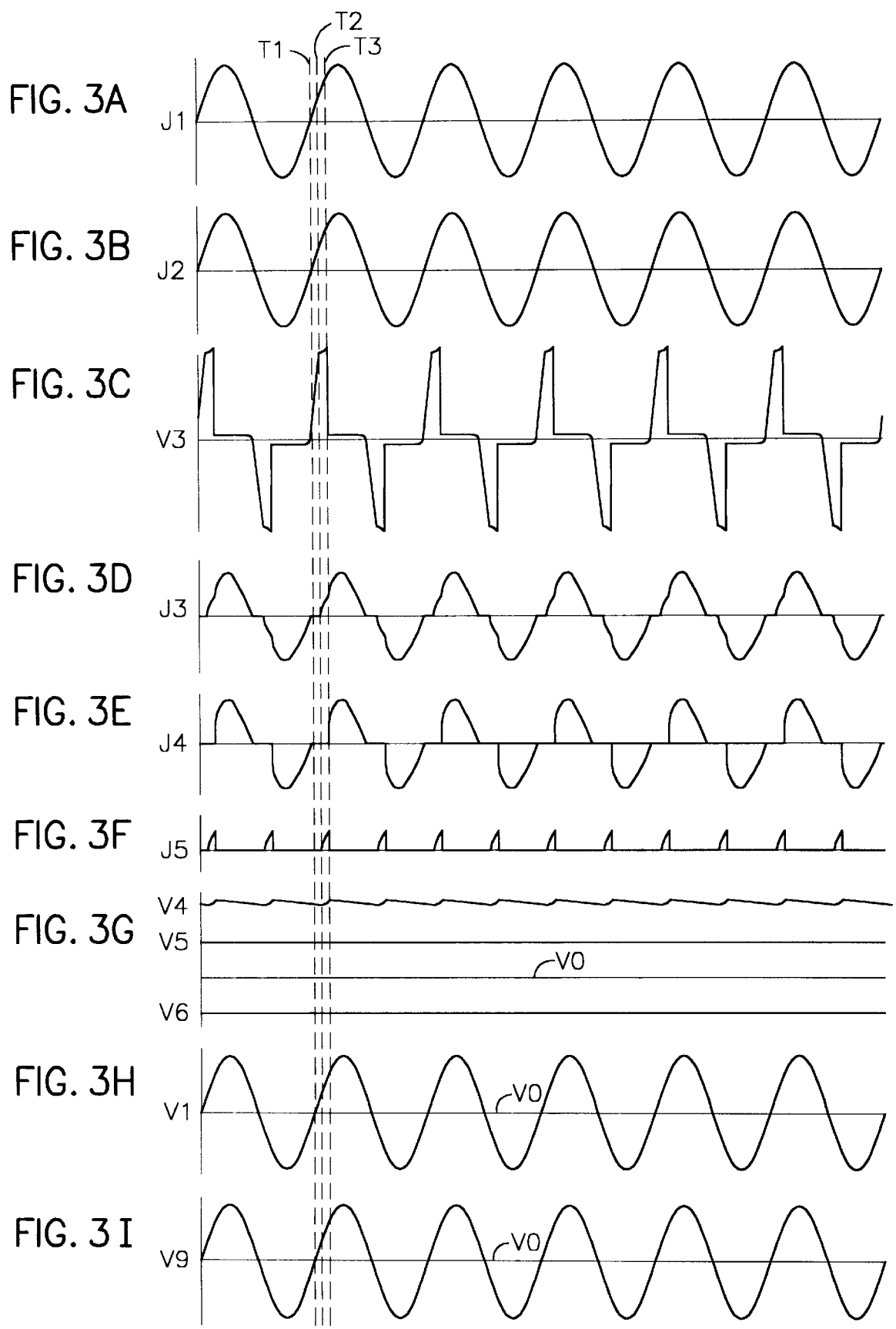

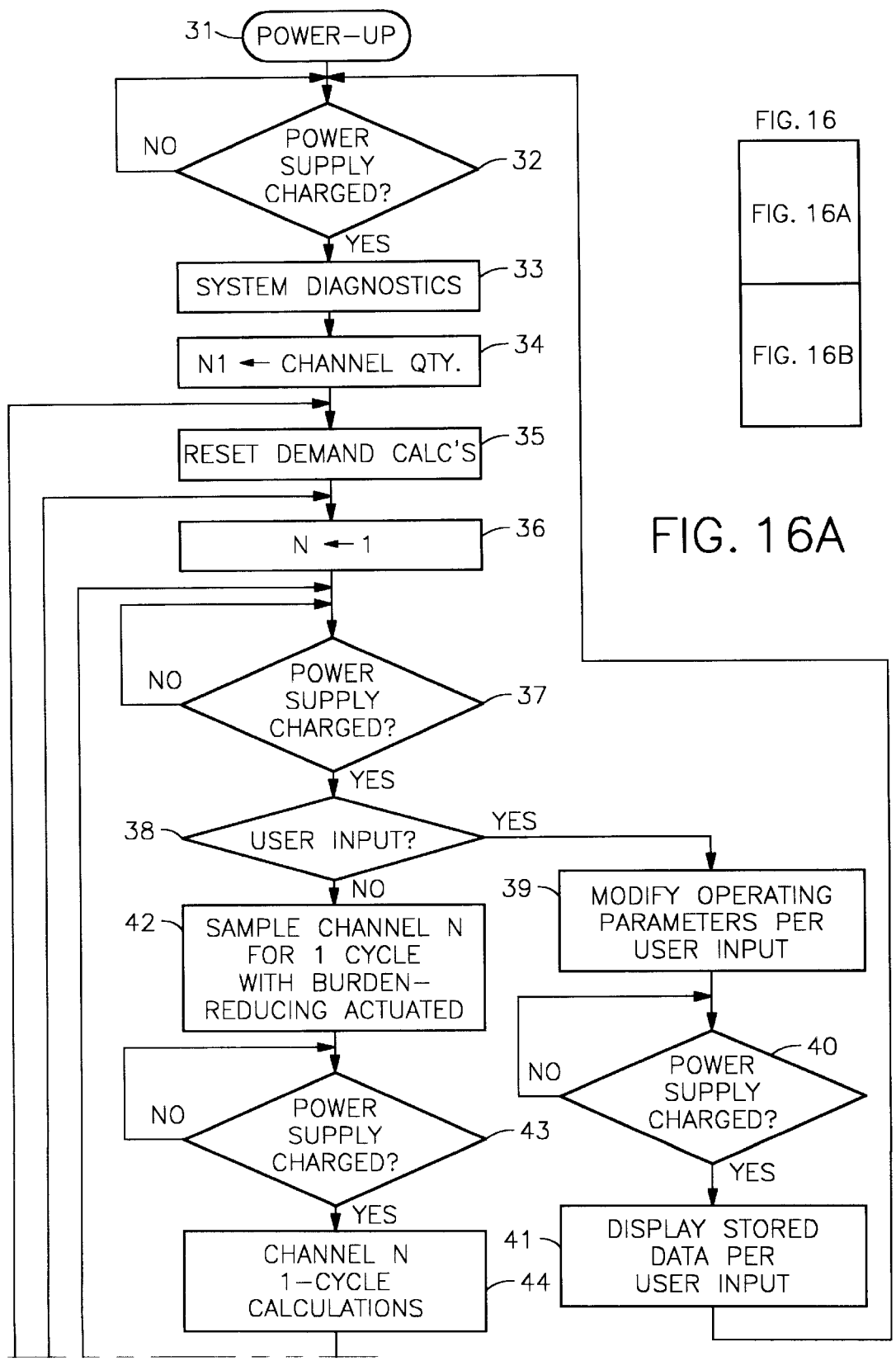

SELF-POWERED CURRENT MONITOR

BACKGROUND

Field of the Invention

This invention relates to monitoring electric current in electric power systems, and more particularly to a current monitor which derives its operating power from one or more electric current inputs.

BACKGROUND OF THE INVENTION

General

An electric current flowing in a conductor causes heating of the conductor. Electric energy is converted to thermal energy everywhere that electric current is flowing (except in specialized equipment utilizing superconducting materials). Generally speaking, the amount of thermal energy produced is proportional to the resistance of the conductor and to the square of the current magnitude. Electric heating equipment uses this principle to produce heat for beneficial purposes. However, this same principle is also at work throughout electric power systems to produce undesirable heat and related energy loss.

Most electric power system components have limited current ratings because of this heating effect of electric current in conductors. Proper design and operation of electric power systems depends heavily on the magnitude of current conducted by cables and equipment. To assist with safe operation, it is common practice to install ammeters and other current monitoring devices at various locations in electric power systems.

While voltages stay relatively constant in a well-designed electric power system, current magnitudes are continually varying as loads are turned on and off. Of particular interest is the maximum current that is maintained long enough to cause significant heating of conductors and equipment. This "maximum current demand" can be calculated from either detailed information about each load connected to an electrical system, or it can be determined by monitoring actual load currents.

Maximum current demand is important, as this is the magnitude of maintained current that equipment must be able to safely handle. Brief current surges many times normal may occur as motor loads and other loads start and stop. These brief currents will not, however, have much impact on maximum current demand due to their relatively short durations.

To protect electrical systems from overheating and resulting unsafe operating conditions, the National Electrical Code (ANSI/NFPA 70-1996) requires that electrical systems be rated for the maximum current demand that will be imposed on them. Compliance may be shown by calculating the total of all loads and applying demand factors in accordance with Article 220 "Branch Circuit, Feeder, and Service Calcs." Alternatively, for existing installations, section 220-35 provides that additional load may be added to existing feeders and services when "The maximum demand data is available for a one-year period" and "The existing demand at 125 percent plus the new load does not exceed the ampacity of the feeder or rating of the service."

For the above reasons, it is very desirable to monitor maximum current demand, and not just present current levels.

It is also desirable to monitor current waveform distortion, in addition to current magnitudes and maximum current demand. In recent years, nonlinear loads connected to electric power systems have greatly increased. These nonlinear loads usually are the result of electronic power supplies within electrical equipment. Nonlinear loads result in electric current waveforms that are distorted—they are no longer simple sine waves. The distorted waveforms are said to contain "harmonics."

Theoretically speaking, a distorted repeating waveform can be considered to be the sum of many perfect sine waves, with the frequency of each sine wave being a different multiple of the fundamental frequency (the fundamental frequency is the frequency that the combined waveform repeats, usually the power frequency of 50 or 60 hertz). Each of these perfect sine waves (except the fundamental sine wave) is called a "harmonic." Harmonics can adversely affect an electric power system. Monitoring harmonic currents within electric power systems is becoming more routine as problems caused by harmonics become more common.

Existing current monitoring systems that are able to monitor current demand and harmonics generally require a separate voltage source for operating power. This adds to the cost of installation. Also, current monitoring at some locations is impractical due to the lack of a suitable voltage source. To eliminate this problem, a current monitor that derives operating power from one or more input currents is desirable.

Most current monitoring systems for a-c (alternating-current) electric power systems utilize current transformers to provide input currents that are isolated from the electric power system conductors. The primary winding of a current transformer is connected in series with a current-carrying conductor while the secondary winding is magnetically coupled to the primary winding by a suitable magnetic core. A current is induced in the secondary winding that is proportional to the primary current. The secondary current is isolated from the primary current and is smaller than the primary current by the turns ratio of the primary and secondary windings. The primary winding frequently consists of only one turn, which is often just the current-carrying conductor installed through an opening in the middle of the current transformer magnetic core. The secondary winding usually consists of multiple turns wrapped around the magnetic core.

In order for the secondary current generated by a current transformer to be an accurate representation of the primary current the impedance of the circuit connected to the secondary winding must be kept low so that current can flow freely. The impedance of the secondary circuit is often called the "burden." This burden is in series with the secondary current and results in a voltage that opposes the flow of secondary current. This opposing voltage is normally proportional to the magnitude of the current and the magnitude of the impedance, in accordance with Ohm's Law. This opposing voltage causes the secondary current to be smaller than if there were no burden (a burden of zero ohms). The accuracy of the current transformer secondary current is affected by both the magnitude of the burden of the secondary circuit and the type of current transformer used. Larger (more expensive) current transformers are usually less affected by secondary burden than smaller (less expensive) current transformers.

The chief technical obstacle to overcome in the design of a self-powered current monitor is the power supply itself. Any derivation of power from an input current will cause a voltage to be induced in the input current circuit that will oppose the flow of the input current. Therefore, a power supply deriving power from an input current appears to the current source to be additional burden. This power supply burden effect tends to reduce the input current and may introduce nonlinearities into it. How seriously the input current is affected by this power supply burden effect depends on the characteristics of the current source from which the input current is derived as well as the magnitude of the power supply burden effect. A good power supply design should minimize this power supply burden effect to facilitate accurate current measurement utilizing inexpensive current transformers as current sources.

If an "ideal" current monitor were possible, it may be conceived to have the following properties:

(a) An "ideal" current monitor would provide all possible data regarding monitored current both for the present and any time in the past. Data provided would include magnitude (RMS, average, peak), harmonic data, frequency (cycles per second), and other data to clarify waveform characteristics that may deviate from a pure sine wave, including a graphic representation of the waveform at any given time.

(b) An "ideal" current monitor would be "self-powered," requiring no external power source beyond the input current that it monitors.

(c) An ideal current monitor would have an input impedance (or "burden") of zero ohms, so that the accuracy of the input current source would not be adversely affected.

Clearly, an ideal current monitor is not practical due to the nearly infinite amount of data that is available for any significant length of time. Any practical monitor will be limited to tracking key historical data, as well as providing detailed information about present current. Also, the "self-powered" requirement of the ideal current monitor appears to be in conflict with the "zero ohms" burden requirement, so some kind of compromise will be necessary in a practical current monitor.

Historical data provided by a practical current monitor should at least include maximum current demand. Current demand may be calculated for each fraction of an hour, and these results may also be saved as historical data for future reference. Also, instantaneous data, such as RMS current magnitude and harmonic distortion, may be logged at regular intervals for future reference.

Prior Art

Historically, analog ammeters have been used extensively for many decades to monitor alternating current in electric power systems. One very common configuration utilizes a current transformer to reduce line current levels down to a range of zero to five amps, with this secondary current used to drive an analog panel meter (with a pointer and some form of moving coil meter movement). This type of analog meter is inherently "self-powered," requiring no separate source of power to operate. Switches are frequently used to select one of several current transformers to be connected to a single analog panel meter, with other current transformer secondaries being safely shorted by the switching mechanism while not connected to the analog panel meter (current transformer secondary windings not properly terminated to a low resistance load are often capable of generating hazardous voltages).

While analog ammeters are very effective at showing present current levels and require no separate power source, they are poor at providing historical information or more detailed information such as harmonic data. While a second "friction pointer" may be dragged by the main pointer and record the instantaneous historical peak, this is not the same as maximum current demand.

Various forms of meters that measure demand have also been available for many decades. They have usually been configured to monitor electric power instead of current and are commonly part of utility power meters used for revenue purposes. Demand meters are generally either "integrated-demand" meters or "lagged-demand" meters.

"Integrated-demand" meters determine maximum demand by a multi-step process. First, the "demand" is found by continuously measuring current or power and calculating its average over a predetermined time period called a "demand interval" (usually 15, 30, or 60 minutes). Then the "demand" is determined for each successive demand interval for an extended period of time (such as a week, a month, or indefinitely). The greatest "demand" during this extended period of time is recorded by electronic or mechanical means and is said to be the "maximum demand."

A "lagged-demand" meter is similar to a standard analog meter in which the dampening of the pointer is highly accentuated. Pointer movement is usually accomplished by thermal heating effects to attain the long time delays required. The slow-moving demand pointer may move a friction pointer to record maximum demand.

Another method of calculating demand is the "sliding window integrated-demand" method. This is similar to the integrated-demand method, except that the demand interval slides through time (each successive demand interval overlaps the previous demand interval). With this method the demand is calculated more frequently (say once every minute) for the demand interval that just ended. This method overcomes a weakness of the integrated-demand method: The integrated-demand method can miss an occurrence of maximum demand when a load peak of relatively short duration is split between two demand intervals.

Looking at more recent technology, modem electric power monitoring systems are often microprocessor-based and are able to provide a wide range of data. Data is often provided not only about current magnitudes and harmonics, but also about voltages and almost any combination of the two, including power, reactive power, and transient phenomena. Many of these systems come close to the "ideal" current monitor regarding data that is provided, but the inventor is unaware of any current monitoring system that is self-powered (utilizing input current only) and that provides useful historical and harmonic data.

Some monitoring systems may operate on batteries, and thus do not require external power supply connections, but these are generally intended for temporary monitoring purposes. They are generally not suitable for permanent installation due to limited battery life.

The discussion on prior art up to this point has focused on various established monitoring systems. Consideration also needs to be given to prior art regarding power supply circuits associated with a self-powered current monitor, as these are not typical circuits in common monitoring systems. Power supply circuits that are applicable to the invention described herein find their roots in power system protection and control devices more than in power system monitoring devices.

Means of deriving power from an a-c current is well established prior art dating back to at least the 1970s. Typical prior art power supply configurations generally include:

(a) a current transformer as an external current source,
(b) a rectifying circuit,
(c) a charging capacitor that is charged by rectified current and provides unregulated d-c voltage;
(d) a voltage-regulating circuit that provides regulated d-c (direct-current) power from the unregulated d-c voltage on the charging capacitor, and
(e) a voltage-limiting circuit to shunt input current away from the charging capacitor when the voltage on the charging capacitor reaches a predetermined limit.

Some applications may omit the voltage regulating circuit when the voltage on the charging capacitor is stable enough for the application. Also, some applications may not require a voltage-limiting circuit.

The following discussion regarding related patents will identify some applications that have utilized these types of power supplies. Prior art sensing circuits that may be integral to these types of power supplies will also be identified.

Related Patents

Some patents that relate to self-powered current monitoring or deriving power from input currents will be briefly discussed.

Reissued U.S. Pat. No. Re. 28,851 to Milkovic (reissued 1976) discloses a "Current Transformer with Active Load Termination." This current-sensing configuration utilizes an operational amplifier to produce an output voltage from an input current with almost no burden being imposed on the current source.

U.S. Pat. No. 4,027,203 to Moran and Le Court (1977) discloses a "Protective Switch Device for Electrical Distribution Systems." A power supply derived from a current source is part of the larger protective switch device. The power supply configuration is similar to the prior art discussed above. A sensing resistor is included in the power supply circuit to sense fault current and initiate opening of the protective switch by suitable controls. The burden effect that the power supply circuit has on the input current is said to not seriously affect the sensing of fault currents.

U.S. Pat. No. 4,176,386 to Chow (1979) discloses an "Overcurrent Relay" that is said to simultaneously derive power from an input current and derive an accurate information signal from the same input current. The input circuit is configured to provide a constant impedance burden on the current transformer to minimize distortion of the input current (this is somewhat different from typical prior art discussed above).

U.S. Pat. No. 4,422,039 to Davis (1983) discloses a "Self-Powered Ammeter" with an integral power supply derived from the input current. The power supply configuration is similar to the prior art discussed above, except that an internal transformer has been added ahead of the rectifier circuit. The internal transformer reduces the burden effect that the power supply would otherwise have on the input current source. The internal transformer also helps isolate the power supply circuit from the sensing circuit. This ammeter provides a digital display, but has no means to provide historical data or detailed information beyond indication of present current magnitude.

U.S. Pat. No. 4,466,039 to Moran and Reis (1984) discloses an "Open Circuit Current Transformer Protection Circuit." A voltage-limiting circuit includes a triac connected across a current transformer secondary winding with suitable control means to trigger the triac when voltage reaches a predetermined level.

U.S. Pat. No. 4,471,300 to Harnden and Kornrumpf (1984) and U.S. Pat. No. 4,559,496, to Harnden and Kornrumpf (1985) disclose "LCD Hook-on Digital Ammeters" intended for low-cost consumer use. Only present current magnitude is displayed. Voltages generated by a current transformer are used to directly drive liquid crystal display segments, so a power supply circuit is not required.

U.S. Pat. No. 4,698,740 to Rodgers and Stacey (1987) discloses a "Current Fed Regulated Voltage Supply." Several power supply variations are shown, each deriving power from an input current generated by a current transformer. Each of these configurations is similar to the typical prior art discussed above. The patent appears to be claiming an improvement over prior art by utilizing a special type of current transformer that has a "saturable magnetic stacked joint core" and "a lumped secondary winding." This type of current transformer is designed to generate reduced secondary current during surge conditions on the electric power system. This allows some power supply components to have smaller ratings than would otherwise be practical.

U.S. Pat. No. 4,713,598 to Smith (1987) discloses a "Power Supply Associated with AC Line Relay Switch." Control power is derived either from a current transformer connected in series with a load current or from connections to an electronically-controlled switch (the switch is also connected in series with the load current). When the switch is closed, load current flows and power is derived from the current transformer secondary. When the switch is open, voltage develops across the switch and power is derived from that voltage.

U.S. Pat. No. 5,539,300 to Mathieu (1996) discloses a "Power Supply Device" that is similar to typical prior art discussed above. The claims seem to emphasize preventing the magnetic core of the current transformer from going into saturation and thereby preventing audible noise. The basic power supply configuration shown in FIG. 3 of this patent is very similar to that shown in FIG. 7 of U.S. Pat. No. 4,698,740 (see above).

U.S. Pat. No. 5,552,978 to Moncorge (1996) discloses a "Device for Supplying a Voltage to an Electronic Circuit, In Particular an Electronic Circuit Associated with a Current Sensor Disposed on an Electrical Line." The power supply disclosed is similar to typical prior art discussed above, but with an improvement to quickly charge the power supply upon restoration of power after an outage. This facilitates quick operation (after restoration of power) of power system protective equipment that is dependent upon devices that are powered by the power supply. Current is sensed by a sensing circuit that is completely independent of the power supply input current.

U.S. Pat. No. 5,598,315 to Phillips (1997) discloses a "Self-Power Tripping Relay with Balanced Power Supply Current and Measurement Current." This power supply and sensing arrangement is intended primarily for three-phase circuit breaker tripping circuits. Half of each current cycle is used to charge the power supply, while the other half-cycle is used to sense input current. This patent is an improvement over previous similar patents as the voltage developed during each half cycle has been balanced better to improve overall operation. However, current-sensing accuracy is adversely affected by high secondary burden on the current transformers. Error correction curves are presented that show the difference between actual current and sensed current.

U.S. Pat. No. 5,687,068 to Jamieson (1997) discloses a "Power Supply for In-Line Power Controllers and Two-Terminal Electronic Thermostat Employing Same." Control power is derived either from a current transformer connected in series with a load current or from a voltage transformer connected across an electronically-controlled switch (the switch is also connected in series with the load current). When the switch is closed, load current flows and power is derived from the current transformer. When the switch is open, voltage develops across the switch and power is derived from the voltage transformer.

The above patents illustrate prior art regarding self-powered current monitoring, power supplies with current sources, and input current-sensing circuits integral to some of the same power supplies. However, none of them fulfill the objects of the self-powered current monitor invention described herein.

Objects and Advantages

Accordingly, some objects and advantages of the present invention are:

(a) to provide a self-powered current monitor that will provide visual indication of various characteristics of one or more electric currents, including maximum current demand and other historical data, as well as detailed information about present current, including nonlinear current characteristics;

(b) to provide a self-powered current monitor that will communicate various characteristics of one or more electric currents to other equipment;

(c) to provide a self-powered current monitor that can utilize inexpensive current transformers as sources of input current and still maintain good accuracy;

(d) to provide a power supply circuit that includes a burden-reducing means to temporarily reduce the burden effect that the power supply has on input current sources during periodic sensing of input currents; and (e) to provide a power supply circuit that can derive operating power from any of several input currents while providing means to sense these same input currents.

Further objects and advantages will become apparent from a consideration of the drawings and ensuing description.

BRIEF SUMMARY OF THE INVENTION

The invention described herein is a "self-powered current monitor" that monitors the characteristics of one or more input currents, and derives operating power from one or more of the same input currents. Visual indication of current characteristics may be provided by a local display, or data may be communicated to other equipment for further processing.

The input currents will usually be generated by one or more current transformers external to the current monitor, though other types of current sources may also be utilized to generate input currents. The current transformers may be almost any type commonly utilized in electric power systems.

The current monitor's internal power supply is designed to minimize the burden effect that the power supply has on the input current source. This is done through one or both of the following methods:

(a) An internal transformer may be utilized to better match the power supply input requirements to the characteristics of typical current transformer secondary windings. This reduces the burden effect of the power supply compared to the burden effect of the power supply without the internal transformer.

(b) A power supply burden-reducing circuit may be included to sharply reduce the burden effect that the power supply has on the input current source for brief periods while input current is being sensed. While the input current is being sensed, the power supply utilizes an energy storage device (such as a capacitor) to continue supplying operating power to the rest of the current monitor.

The current monitor periodically senses the waveform of each input current. While each input current is being sensed, the input current passes through a precision resistor with low resistance. The voltage across this resistor is proportional to the input current (in accordance with Ohm's Law). This analog voltage signal is amplified (if necessary) and applied to the input of an analog-to-digital converter circuit. The analog-to-digital converter circuit provides a digital signal to a microprocessor. The microprocessor analyzes the digital waveform data and calculates various characteristics of the input current. Calculation results are displayed on a local display or communicated to other equipment via a suitable interface circuit. A memory circuit is included to store working data and program data. A user interface circuit allows the user to modify operating parameters and modify how data is displayed.

Input current characteristics that are calculated by the current monitor may include any parameter that can be calculated from one-cycle waveforms of the input currents, including the root-mean-square (RMS) magnitude, average magnitude, peak magnitude, magnitudes of harmonic frequency components, percentage of harmonic distortion, form factor, crest factor, equivalent k-factor for transformers with harmonic rating, and graphical representation of the waveform. Data may be logged at regular intervals for future reference. The current monitor also calculates cur-rent demand based on periodic one-cycle samples of the input currents. Maximum current demand is stored for future reference.

BRIEF DESCRIPTION OF THE DRAWINGS

FIG. 2B is combined with FIG. 2A, the entire current monitor is shown with power supply details not shown in FIG. 1. FIG. 2B may also be laid beside FIGS. 4, 6, 7, 9, 11, 12, 13, 14, and 15 to show the entire current monitor with various power supply and current-sensing configurations.

FIGS. 3A through 3I show typical operating waveforms associated with the power supply and current-sensing configuration of FIG. 2A.

FIGS. 16A and 16B show a flowchart to illustrate the operation of the microprocessor.

DETAILED DESCRIPTION

List of Reference Characters

Figure 1:
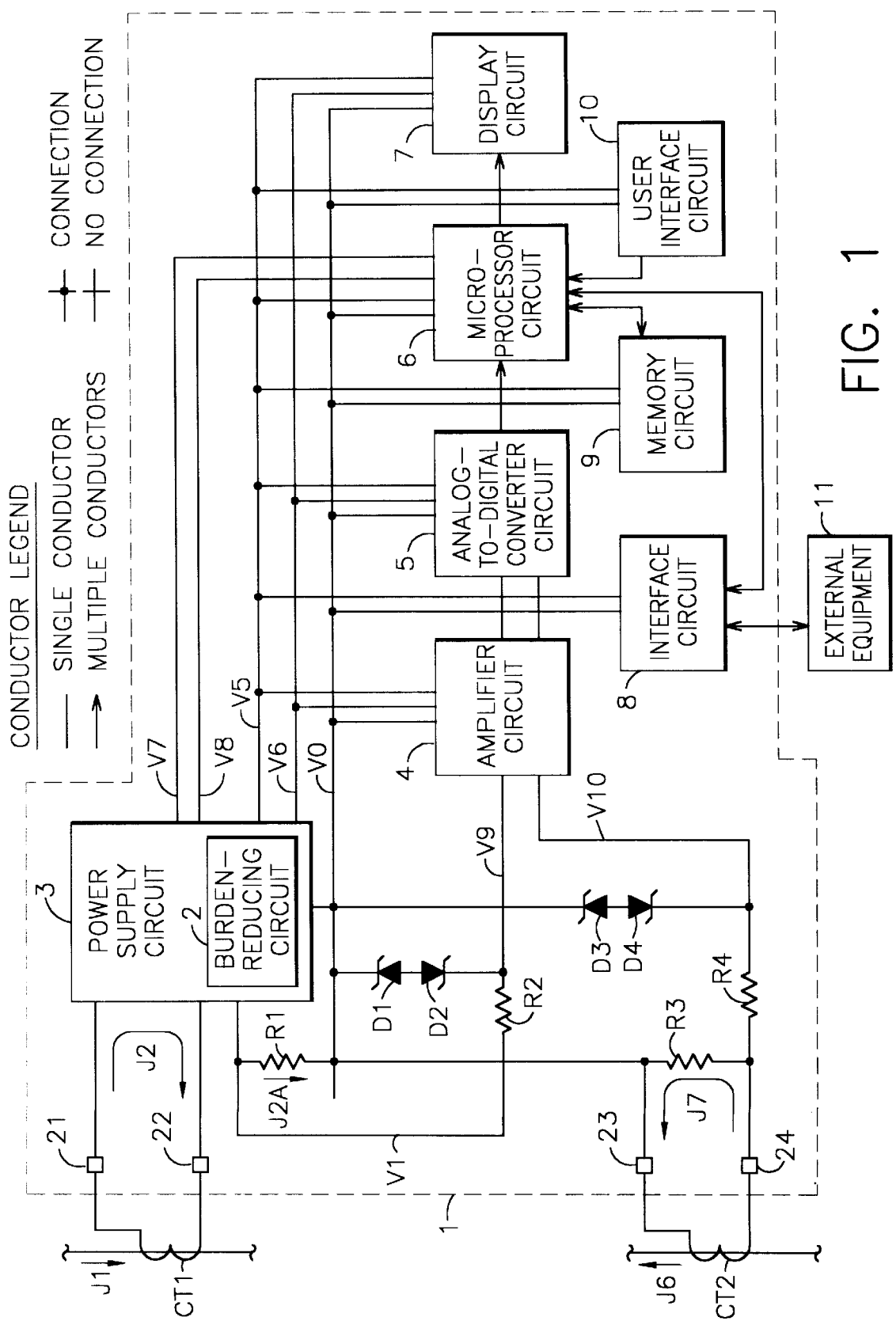
FIG. 1 shows the general schematic configuration of the self-powered current monitor. The power supply is shown as a block. Other figures will show several possible configurations for the power supply in more detail.

The following reference characters are used to identify the corresponding items on the drawings.

Figure 16B:
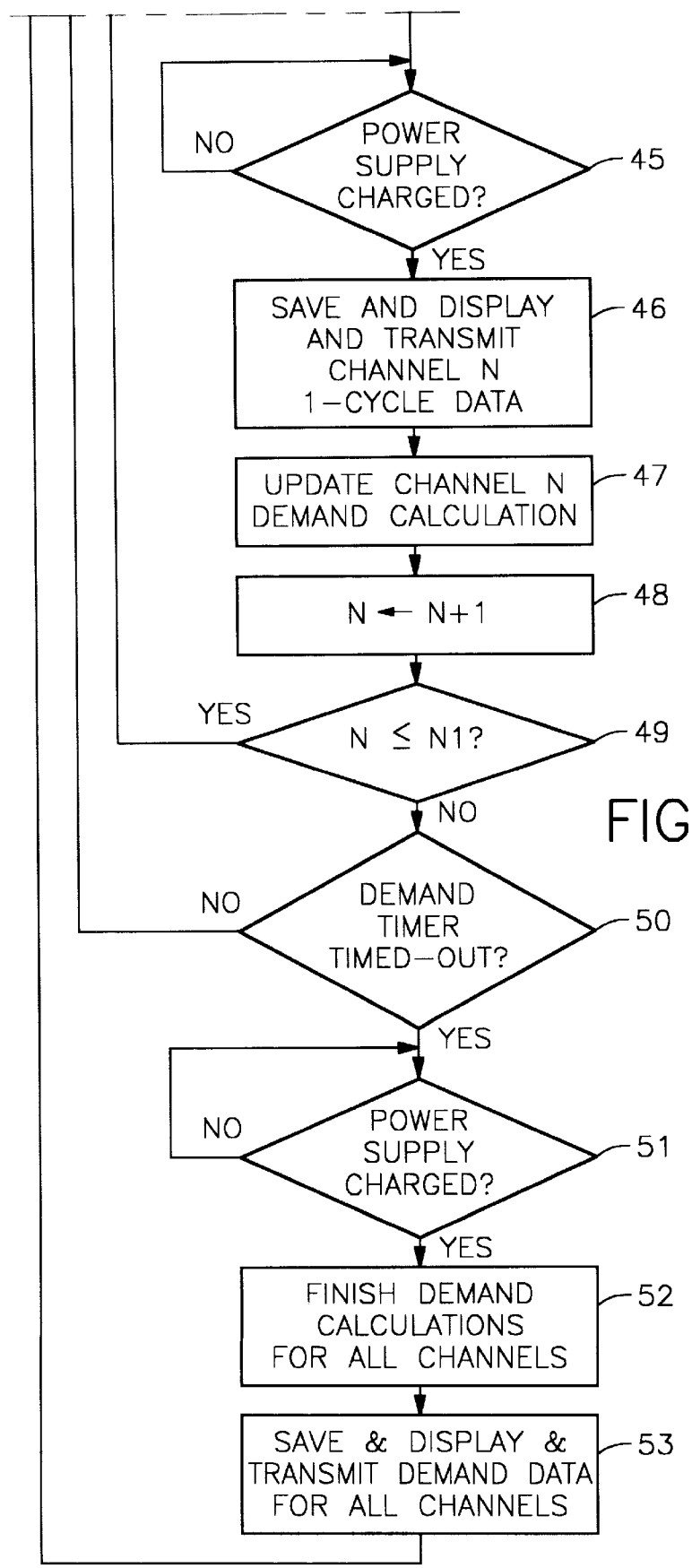

1 Self-powered current monitor
2 Burden-reducing circuit
3 Power supply circuit (provides regulated d-c power output)
4 Amplifier circuit (amplifies input signals)
5 Analog-to-digital converter circuit (converts analog signals to digital signals)
6 Microprocessor circuit (controls operation of the current monitor)
7 Display circuit (displays output data and operational parameters)
8 Interface circuit (communicates to external equipment)
9 Memory circuit (stores working data and program data)
10 User interface circuit (facilitates user input)
11 External equipment (receives data from self-powered current monitor)
12 D-c to d-c converter (with isolated output)
13 Voltage-limiting circuit (for input channel one)
14 Voltage-limiting circuit (for input channel two)
15 Voltage regulator circuit (provides power supply positive voltage output)
16 Voltage inverter circuit (provides power supply negative voltage output)
17 Voltage detector circuit (verifies charge state of power supply)
18 Voltage detector circuit (used as part of voltage-limiting control)
19 Rectifying, burden-reducing, and current-sensing circuit (for input channel two)
20 Rectifying and burden-reducing circuit (for input channel two)
21 Terminal (for input channel one input current)
22 Terminal (for input channel one input current)
23 Terminal (for input channel two input current)
24 Terminal (for input channel two input current)
25 Latch coil (part of control relay CR1)
26 Unlatch coil (part of control relay CR1)
27 Normally open contact (part of control relay CR1)
28 Failure protection circuit (for input channel one)
29 Failure protection circuit (for input channel two)
30 Photovoltaic isolator
31–53 FIGS. 16A and 16B flowchart operations
54 Rectifying, burden-reducing, and current-sensing circuit (for input channel two)
BR1 Full-wave bridge rectifier (input channel one rectifier)
BR2 Full-wave bridge rectifier (part of input channel one failure protection circuit)
BR3 Full-wave bridge rectifier (input channel two rectifier)
C1 Capacitor (power supply unregulated voltage charging capacitor)
C2 Capacitor (power supply positive voltage output capacitor)
C3 Capacitor (power supply negative voltage output capacitor)
C4 Capacitor (part of failure protection circuit 28 protection circuit)
C5 Capacitor (positive charging capacitor for isolated power supply)
C6 Capacitor (negative charging capacitor for isolated power supply)
CT1 Current transformer (external current source for input channel one)
CT2 Current transformer (external current source for input channel two)
D1 Zener diode (protects input channel one sensing circuits from surges)
D2 Zener diode (protects input channel one sensing circuits from surges)
D3 Zener diode (protects input channel two sensing circuits from surges)
D4 Zener diode (protects input channel two sensing circuits from surges)
D5 Diode (part of input channel one power supply rectifier circuit )
D6 Diode (part of input channel one power supply rectifier circuit)
D7 Diode (protects silicon-controlled rectifier SCR1 gate from reverse voltage)
D8 Zener diode (part of silicon-controlled rectifier SCR1 gate control circuit)
D9 Diode (protects silicon-controlled rectifier SCR2 gate from reverse voltage)
D10 Zener diode (part of silicon-controlled rectifier SCR2 gate control circuit)
D11 Zener diode (part of input channel one charge pulse sensing circuit)
D12 Zener diode (part of input channel one charge pulse sensing circuit)
D13 Zener diode (part of input channel one failure protection circuit)
D14 Diode (part of gate control circuit for field-effect transistors)
D15 Diode (part of gate control circuit for field-effect transistors)
D16 Zener diode (adjusts voltage response of voltage detector circuit 18)
D17 Zener diode (adjusts voltage response of voltage detector circuit 17)
D18 Diode (prevents discharge of capacitor C1) GND Connection to ground potential (stabilizes voltages)
31 A-c system current (external current transformer CT1 primary current)
J2 Input current (for input channel one)
J2A Current through resistor R1 (produces voltage signal for input channel one)

J3 Secondary current of internal transformer TX1
J4 Current into voltage-limiting circuit (for input channel one)
J5 Power supply charging current
J6 A-c system current (external current transformer CT2 primary current)
J7 Input current (for input channel two)
Q1 Field-effect transistor (part of power supply burden-reducing circuit)
Q2 Field-effect transistor (part of power supply burden-reducing circuit)
Q3 Field-effect transistor (part of combined voltage-limiting/burden-reducing circuit)
R1 Resistor (input channel one sensing resistor)
R2 Resistor (input channel one surge-limiting resistor)
R3 Resistor (input channel two sensing resistor)
R4 Resistor (input channel two surge-limiting resistor)
R5 Resistor (part of silicon-controlled rectifier SCR1 gate control circuit)
R6 Resistor (part of silicon-controlled rectifier SCR2 gate control circuit)
R7 Resistor (part of gate control circuit for field-effect transistors)
R8 Resistor (part of input channel one charge pulse sensing circuit)
R9 Resistor (part of input channel one charge pulse sensing circuit)
R10 Resistor (part of burden-reducing control circuit)
R11 Resistor (part of isolated gate control circuit for field-effect transistors)
SCR1 Silicon-controlled rectifier (part of voltage-limiting circuit 13)
SCR2 Silicon-controlled rectifier (part of voltage-limiting circuit 13)
T1 Time reference (beginning of input current cycle)
T2 Time reference (beginning of power supply charging current J5 pulse)
T3 Time reference (end of power supply charging current J5 pulse)
T4 Time reference (beginning of burden-reducing mode)
T5 Time reference (end of burden-reducing mode)
T6 Time reference (low power supply charge detected)
T7 Time reference (adequate power supply charge restored)
TX1 Internal transformer (for input channel one)
TX2 Internal transformer (for input channel two)
V0 Common bus for power supply circuits, sensing circuits, and logic circuits.
V1 Conductor carrying input channel one voltage signal
V2 Voltage across current transformer CT1 secondary winding
V3 Voltage across internal transformer TX1 secondary winding
V4 Power supply unregulated voltage bus
V5 Power supply positive regulated voltage bus
V6 Power supply negative regulated voltage bus
V7 Conductor carrying power supply burden-reducing control signal
V7A Conductor carrying the gate voltage for field-effect transistors Q1 and Q2
V8 Conductor carrying power supply charge status signal
V9 Conductor carrying input channel one voltage signal (surge protected)
V10 Conductor carrying input channel two voltage signal (surge protected)

Components that are common to more than one figure are identified by the same reference characters.

Definitions

For the purpose of this disclosure, the following terms are defined.

(a) Average magnitude: The average of the instantaneous absolute magnitude of a quantity over one cycle.

(b) Crest factor: The ratio of the maximum value of a waveform to the root-mean-square value of the same waveform.

(c) Current demand: Current magnitude averaged over a specified interval of time (such as 15, 30, or 60 minutes). Current demand is usually expressed in units of amperes.

(d) Demand: An electrical load averaged over a specified interval of time (such as 15, 30, or 60 minutes). Demand may be expressed in units of amperes, watts, vars (volt-amperes reactive), or volt-amperes.

(e) Distortion factor: The ratio of the root-mean-square of the harmonic content of a waveform to the root-mean-square value of the fundamental quantity, expressed as a percent of the fundamental.

(f) Equivalent k-factor for transformers with harmonic rating: The "k-factor" value associated with a nonlinear load current calculated according to Underwriter's Laboratory standard UL 1561 "Dry Type General Purpose and Power Transformers."

(g) Form factor: The ratio of the root-mean-square magnitude to the average magnitude.

(h) Half-cycle: A time period that includes only the positive or negative half of an alternating waveform. In a 60-hertz alternating-current electric power system a full cycle is $\frac{1}{60}$th of a second long (approximately 16.7 milliseconds). A "half-cycle" is half as long, or a time period of approximately 8.3 milliseconds.

(i) Harmonic: A sinusoidal component of a periodic wave having a frequency that is an integral multiple of the fundamental frequency.

(j) Harmonic component magnitude: The root-mean-square magnitude of an individual harmonic.

(k) Input Channel: The signal path and related circuits associated with a particular input current.

(l) Maximum current demand: The greatest of all current demands that have occurred over an extended period of time (such as a week, a month, or indefinitely).

(m) Microcontroller: A type of microprocessor in which circuit functions that are normally external to the microprocessor integrated circuit are included as part of the microprocessor integrated circuit. These functions may include such items as memory, communication ports, time clocks, display drivers, and analog-to-digital converters.

(n) Microprocessor: A general purpose integrated circuit adaptable for specific applications. A microprocessor generally includes arithmetic, logic, and control circuitry required to interpret and execute instructions from a computer program.

(o) Peak magnitude: The maximum value of a periodic waveform.

(p) Root-mean-square magnitude: The square root of the average of the square of the instantaneous magnitude taken over one complete cycle.

(q) RMS: An abbreviation for root-mean-square magnitude.

The Preferred Embodiments

FIG. 1 shows a block diagram illustrating the general configuration of the self-powered current monitor 1. A power supply circuit 3 derives power from an input current J2 and provides regulated d-c (direct-current) power to other circuits. A burden-reducing circuit 2 may be included as part of power supply circuit 3. Power supply circuit 3 and burden-reducing circuit 2 are shown in more detail in subsequent figures and are discussed further in the discussion relating to those figures.

A current transformer CT1 acts as a current source to generate input current J2. Current transformer CT1 is external to current monitor 1 and may be almost any type of current transformer (or other current source), but will normally be a toroidal type or split-core type of current transformer installed around a current-carrying conductor. An a-c system current J1 flows in the current-carrying conductor as part of a larger electric power system. A-c system current J1 causes input current J2 to flow by the transformer action of current transformer CT1. Input current J2 is proportionally smaller than a-c system current J1 by the turns ratio of current transformer CT1. The secondary winding of current transformer CT1 is connected to current monitor 1 at terminals 21 and 22 by short lengths of insulated wire.

Current monitor 1 senses input current J2 for brief time periods several times per minute. During these sensing periods, input current J2 is routed through resistor R1 and causes an analog signal across resistor R1 that is a voltage signal proportional to input current J2 (in accordance with Ohm's Law). The current through resistor R1 is labeled current J2A because it may not be equal to input current J2 during normal power supply charging cycles. Whether or not currents J2 and J2A are always equal depends on the particular power supply and current-sensing configuration.

The voltage signal across resistor R1 is conducted by conductor V1 to resistor R2 and is applied to the input of amplifier circuit 4 by conductor V9. Resistor R2 and zener diodes D1 and D2 are included to limit the maximum voltage input to amplifier circuit 4. Without these, high voltages across resistor R1 caused by high input currents (resulting from short-circuit currents or other surge currents in the electric power system) may damage amplifier circuit 4. Zener diodes D1 and D2 will conduct only if the voltage signal across resistor R1 exceeds their reverse breakdown voltage rating. Resistor R2 will limit current flow through zener diodes D1 and D2 to a safe operating value. The resistance of resistor R2 must be relatively small compared to the input resistance of amplifier circuit 4 so that the voltage signal transferred from resistor R1 to amplifier circuit 4 will not be significantly reduced under normal operating conditions.

Similar to input current J2, an optional second input current J7 is shown generated by a current transformer CT2 with an a-c system current J6. Current transformer CT2 connects to the current monitor at terminals 23 and 24. A-c system current J6 causes input current J7 to flow which is proportionally smaller than J6 by the turns ratio of current transformer CT2. As shown in FIG. 1, this second input is not configured to provide power to the current monitor (FIGS. 12, 13, 14, and 15, to be discussed later, show alternative configurations that utilize this second input current as a second source of power).

A resistor R3 is in series with input current J7 and thus develops a voltage signal across it that is proportional to input current J7. A resistor R4 and zener diodes D3 and D4 are included to limit the maximum voltage input to amplifier circuit 4 (similar to resistor R2 and zener diodes D1 and D2 for input current J2). The voltage signal across R3 is conducted from resistor R4 to amplifier circuit 4 by conductor V10.

Circuits for additional input currents may be provided similar to the input configuration for input current J7. Only two inputs are shown for simplicity of illustration. Other types of current-sensing circuits may be used, such as an active load termination as described in reissued U.S. Pat. No. Re. 28,851 to Milkovic (reissued 1976) (see above under "Background of the Invention-Related Patents). While other types of current-sensing circuits may be utilized, simple resistors will be shown throughout this disclosure for simplicity of illustration and operation.

Amplifier circuit 4 amplifies the voltage signals across resistors R1 and R3 to levels suitable for input to analog-to-digital converter circuit 5. Amplifier circuit 4 may be omitted if resistors R1 and R3 are sized so that the voltages across them are suitable for direct input to analog-to-digital converter circuit 5 (less expensive current transformers may not be rated for the increased burden resulting from higher resistances required to eliminate amplifier circuit 4). Amplifier circuit 4 has a separate amplifier for each input. A detailed description of amplifier circuit 4 is not included herein since it involves only prior art.

Analog-to-digital converter circuit 5 periodically performs a series of samples of the voltage signals across resistors R1 and R3 and converts these voltage signals into a digital signal when requested by microprocessor 6. The sampling frequency must be fast enough to clearly define any significant nonlinearities present in the voltage signal waveforms. Approximately 100 samples for one waveform cycle is adequate for typical power system current waveforms. The digital signal is transmitted to microprocessor 6 for analysis. Analog-to-digital converter circuit 5 has a separate analog input for each input current. The digital signal output may be communicated to microprocessor 6 via serial or parallel communication. A detailed description of analog-to-digital converter circuit 5 is not included herein since it involves only prior art.

Optionally, amplifier circuit 4 could be provided with multiple inputs and a single output connecting to analog-to-digital converter circuit 5. This requires a communication connection between the amplifier circuit 4 and microprocessor 6 so that microprocessor 6 can control which input is selected. However, analog-to-digital converter integrated circuits are commonly available with multiple inputs, so this optional configuration is not preferred.

Microprocessor 6 is programmed to analyze the digital signal and produce output data for visual display by display circuit 7. Microprocessor 6 may also actuate burden-reducing circuit 2 while analog-to-digital converter circuit 5 is sampling the input across resistor R1. Microprocessor 6 also interfaces to memory circuit 9, user interface circuit 10, and interface circuit 8. Operation of microprocessor 6 is explained in more detail in the discussion for FIGS. 16A and 16B. A detailed description of microprocessor 6 is not included herein since it involves only prior art.

Display circuit 7 includes a liquid crystal display to minimize power consumption. The presently preferred embodiment includes only textual output to keep the cost of the current monitor down. A graphic display may be used if it is desired to display waveforms or other data graphically, though this will increase the cost. A detailed description of display circuit 7 is not included herein since it involves only prior art.

User interface circuit 10 consists of pushbuttons or similar user interface means connected to microprocessor 6 to allow the user to set parameters and control what is displayed. In its simplest form it consists of several pushbutton-type switches each connected to an input terminal of microprocessor 6. In this form a direct connection to the power-distributing circuit may not be required. A detailed description of user interface circuit 10 is not included herein since it involves only prior art.

Memory circuit 9 contains program data, current demand data, and other working memory for use by microprocessor 6. Program data is stored in permanent Read Only Memory (ROM), while current demand data may be stored in Electrically Erasable Programmable Read Only Memory (EEPROM) or Static Random Access Memory (SRAM) with battery backup. Some SRAM (with or without battery backup) is used by microprocessor 6 for calculations, communication, and display functions. Part or all of the memory circuit may be integral to the microprocessor circuit. This is especially the case if the microprocessor is implemented with a "microcontroller" type of integrated circuit. A detailed description of memory circuit 9 is not included herein since it involves only prior art.

Interface circuit 8 is included to allow communication to external equipment so that the current monitor may be installed as part of a larger monitoring system or in locations not normally accessible. Part or all of this interface circuit 8 may be integral to microprocessor 6. This is especially the case if microprocessor 6 is implemented with a "microcontroller" type of integrated circuit. The communication means may be any established method, including electric signals on metallic wires or cables, radio waves (or other forms of electromagnetic radiation) through air or other medium, or light waves through air or optical fiber. A detailed description of interface circuit 8 is not included herein since it involves only prior art.

Conductor V0 is the common bus for the power supply circuits, signal circuits, and logic circuits. Conductor V5 is the power supply positive regulated voltage bus. Conductor V6 is the power supply negative regulated voltage bus. Together, these conductors comprise a power-distributing circuit to supply regulated d-c power to the various subsystems of the current monitor. The power supply output voltages for the preferred embodiment are plus and minus five volts. The power supply circuit may be configured for other voltages or additional voltages depending on the requirements of the various subsystems receiving power.

Burden-reducing circuit 2 is controlled by a signal from microprocessor 6. Conductor V7 conducts the burden-reducing control signal from microprocessor 6 to power supply circuit 3 to actuate burden-reducing circuit 2 while input current J2 is being sensed. Actual sensing of input current J2 may be delayed for a few cycles after burden-reducing circuit 2 is activated to allow any transient d-c offset currents present in input current J2 to decay, so that accuracy will not be adversely affected.

If input current J2 falls below a predetermined value, power supply 3 will not be able to function reliably. A "charge status" signal is generated by power supply 3 to alert microprocessor 6 whenever stored energy in power supply 3 is not adequate to support continued processing. Conductor V8 conducts the charge status signal from power supply 3 to microprocessor 6.

To facilitate operation at low input current levels, the various circuit components of the self-powered current monitor are chosen to require minimal power from power supply circuit 3.

Many of the subsystem blocks shown in FIG. 1 are optional. Those that are not optional include power supply circuit 3, analog-to-digital converter circuit 5, microprocessor circuit 6, and memory circuit 9. Also, either display circuit 7 or interface circuit 8 is necessary for the current monitor to be able communicate data visually or by other means.

Figure 2A:
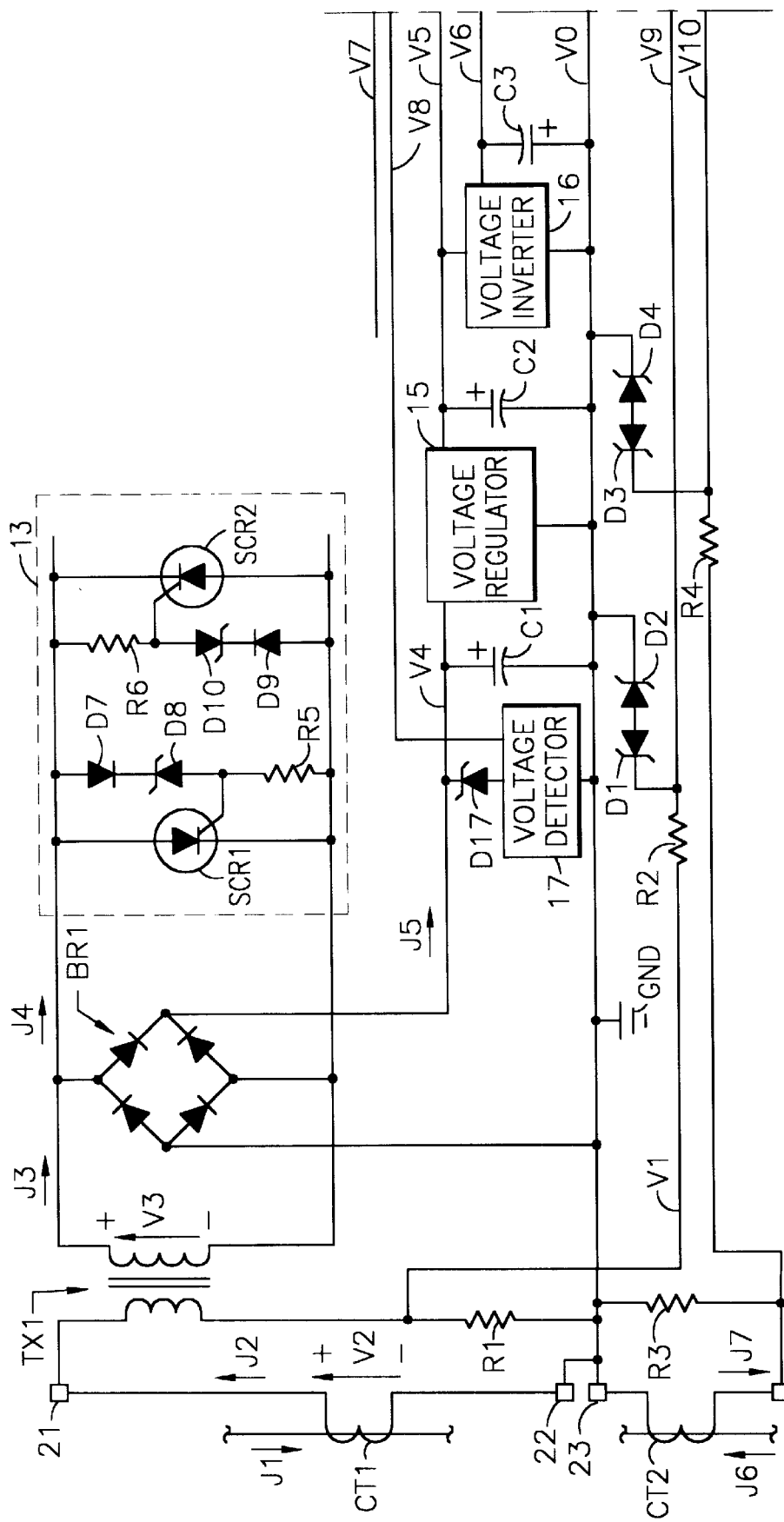
FIG. 2A shows a relatively simple embodiment of a power supply and current-sensing configuration with an internal transformer, but without a burden-reducing circuit.
Figure 2B:
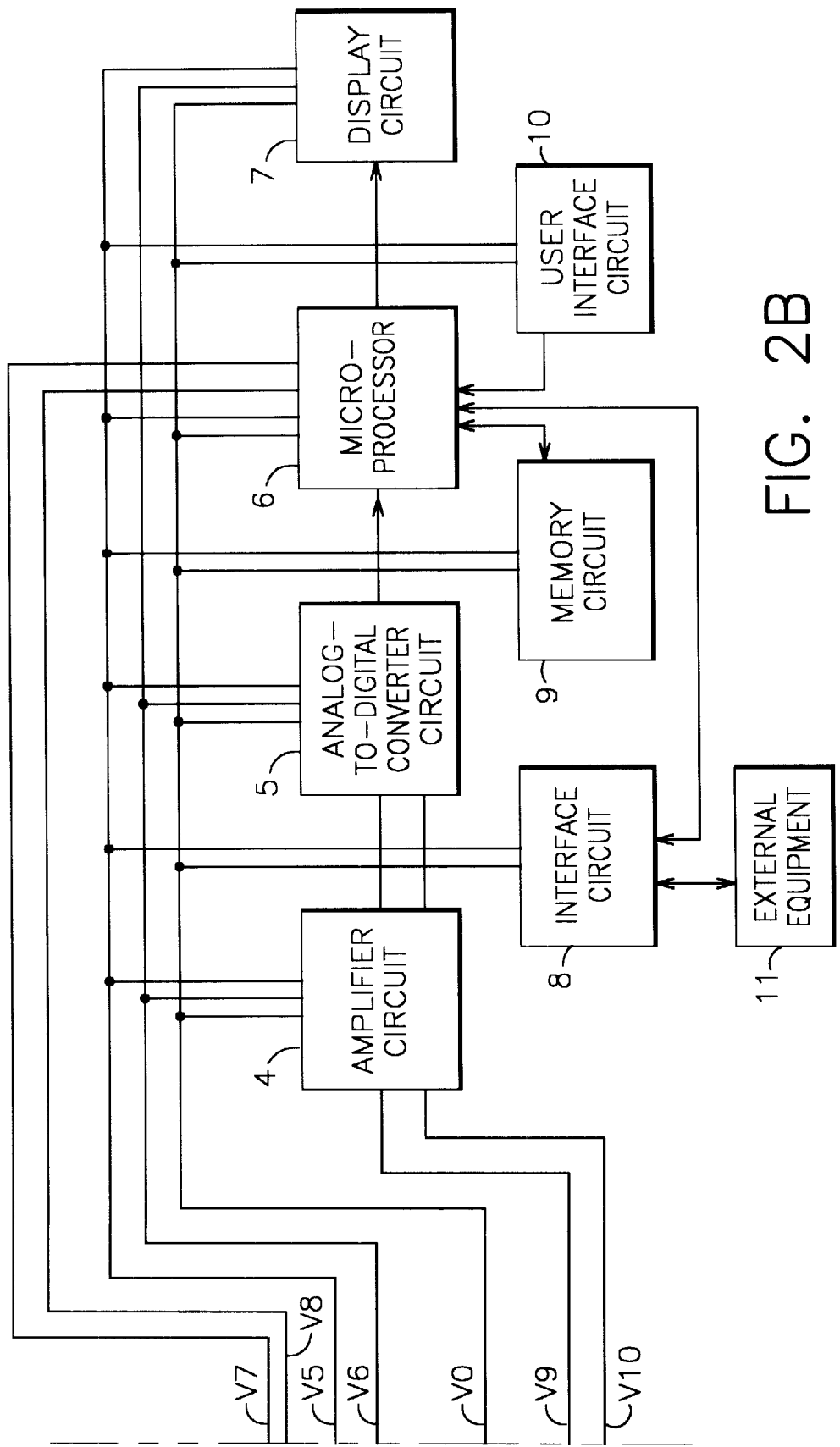
FIG. 2B is similar to the right half of FIG. 1. When

FIG. 2A shows one possible embodiment of power supply circuit 3 and current sensing circuits in more detail than FIG. 1. FIG. 2B is similar to the right side of FIG. 1 and may be laid beside FIG. 2A to show the complete current monitor.

Components in FIGS. 2A and 2B that are also shown in FIG. 1 function as described previously in the discussion for FIG. 1.

FIG. 2A shows the simplest of the illustrated power supply embodiments. A burden-reducing circuit is not included in this embodiment, so conductor V7 (which carries the burden-reducing control signal) is left unconnected at the power supply.

An internal transformer TX1 is internal to the current monitor and is included to better match the input requirements of the power supply to the output characteristics of current transformer CT1. Standard current transformers usually have zero to five amp secondary outputs with little capacity to generate sustained voltages. The power supply, on the other hand, needs relatively little current but relatively high voltages.

The use of an internal transformer to reduce the burden effect of the power supply is not new. A similar configuration is used as part of the "Self-Powered Ammeter" disclosed in U.S. Pat. No. 4,422,039 to Davis (1983) as discussed above under "Background of the Invention-Related Patents."

Internal transformer TX1 basically acts like a current transformer with excessive burden in the secondary circuit. Input current J2 flows through the primary winding of internal transformer TX1 and causes secondary current J3 to flow. Current J3 is smaller than current J2 by the turns ratio of internal transformer TX1.

Current J3 is alternating at the electric power system frequency (typically 50 or 60 hertz) and is rectified by full-wave bridge rectifier BR1. Rectified charging current J5 charges capacitor C1, which acts as a charge-storing device. This results in an unregulated positive d-c voltage on bus V4 (unless otherwise stated, voltages indicated are relative to common bus V0). Voltage regulator 15 converts this unregulated voltage to a positive regulated voltage on bus V5. Capacitor C2 helps stabilize the positive regulated voltage. Voltage inverter 16 generates a negative regulated voltage on bus V6. Capacitor C3 helps stabilize the negative regulated voltage.

Voltage regulator 15 may be a linear type of regulator, or a switching type of regulator to improve efficiency. A detailed description of voltage regulator 15 is not included herein since it involves only prior art.

Voltage inverter 16 may be implemented with a standard integrated circuit along with an external capacitor utilized as part of a charge pump circuit. A detailed description of voltage inverter 16 is not included herein since it involves only prior art.

The combination of voltage regulator 15, voltage inverter 16, and capacitors C2 and C3 act together as a voltage-regulating circuit that provides regulated d-c power from unregulated voltage provided by a charge-storing circuit comprising capacitor C1.

There are many ways to derive regulated d-c power from an unregulated d-c voltage source. The configuration shown in FIG. 2A (utilizing voltage regulator 15 and voltage inverter 16) is just one of many configurations possible utilizing prior art. This same configuration is utilized in subsequent drawings for simplicity of illustration. It is not the intent of this disclosure to limit the power supply to the components illustrated.

Voltage detector circuit 17 and zener diode D17 are configured to send a charge status signal to the microprocessor. The charge status signal carried by conductor V8 is driven high whenever the voltage on capacitor C1 is above a predetermined value. A high charge status signal indicates that stored energy in the capacitor is adequate to provide power to the current monitor for the next series of operations (see FIG. 16 flowchart). Three-terminal voltage detectors are commonly available in ratings from approximately two to six volts. Zener diode D17 is included to raise the effective detected voltage to a level higher than six volts. A detailed description of voltage detector circuit 17 is not included herein since it involves only prior art.

Without some kind of voltage-limiting circuit, the voltage on unregulated voltage bus V4 could become excessively high. Voltage-limiting circuit 13 has silicon-controlled rectifiers, diodes, zener diodes, and resistors configured to function as an electronic switch that limits the voltage produced by the secondary winding of internal transformer TX1. While capacitor C1 is charging, the magnitude of the transformer secondary voltage V3 is equal to the unregulated voltage on bus V4 plus the forward voltage drops of two diodes in full-wave bridge rectifier BR1. As the unregulated voltage on bus V4 increases, a voltage level is reached that triggers the gate circuit of silicon-controlled rectifier SCR1 or SCR2. After silicon-controlled rectifier SCR1 or SCR2 is triggered, secondary current J3 is shunted through the silicon-controlled rectifier so secondary voltage V3 collapses to the forward voltage drop of the silicon-controlled rectifier. Current J4 is the excess part of secondary current J3 that is shunted by voltage-limiting circuit 13. As soon as a silicon-controlled rectifier is triggered, charging of capacitor C1 stops for the remainder of the half-cycle.

Silicon-controlled rectifier SCR1 limits voltage during the positive half-cycle, while silicon-controlled rectifier SCR2 limits voltage during the negative half-cycle. Zener diodes D8 and D10 determine the voltage level at which the silicon-controlled rectifiers trigger. Resistors R5 and R6 assure that the silicon-controlled rectifiers will not trigger on diode leakage currents. Diodes D7 and D9 prevent reverse bias conditions on the silicon-controlled rectifier gates.

In the presently preferred embodiment, internal transformer TX1 comprises a toroidal saturable magnetic core with approximately ten times as many secondary winding turns as primary winding turns. This results in secondary current J3 being approximately 10% as large as input current J2. More important, the voltage induced in the primary circuit of internal transformer TX1 is only approximately 10% of secondary voltage V3. This reduces the peak burden effect of the power supply on current transformer CT1 by a factor of ten.

The ability of internal transformer TX1 to generate secondary voltage is proportional to the core cross sectional area and the number of secondary winding turns. A good design must balance the desire for a small core against the practicality of windings with more turns. The presently preferred embodiment utilizes a toroidal core made of grain-oriented silicon steel with a cross sectional area of approximately two square centimeters, with ten primary winding turns and one hundred secondary winding turns.

Ground connection GND is included to provide a stable voltage reference.

FIG. 2B, as previously mentioned, is similar to the right side of FIG. 1 (see the discussion for FIG. 1).

FIGS. 3A through 3I illustrate typical operating waveforms of the power supply and current-sensing configuration shown in FIG. 2A.

FIG. 3A shows a typical waveform for a-c system current J1. A simple sine wave is shown for simplicity of illustration. In actual applications the waveform may show considerable harmonic distortion.

FIG. 3B shows input current J2, which is the secondary current generated by current transformer CT1. This has the same form as a-c system current J1 since it is assumed that current transformer CT1 is not adversely affected by the burden of the secondary circuit. The waveform magnitudes are normalized for clarity of illustration. The magnitude of input current J2 is actually many times smaller than a-c system current 31 (proportional to the turns ratio of current transformer CT1).

FIG. 3C shows internal transformer TX1 secondary voltage V3. As input current J2 begins a new half-cycle at time T1, secondary voltage V3 quickly increases. At time T2 secondary voltage V3 reaches the level required to start charging capacitor CI. Between times T2 and T3 capacitor C1 is charging, and secondary voltage V3 follows the charging voltage on unregulated voltage bus V4 (see FIG. 3G). At time T3 silicon-controlled rectifier SCR1 triggers, and secondary voltage V3 collapses until another half-cycle begins.

FIG. 3D shows internal transformer TX1 secondary current J3. This current shows significant distortion due to the nonlinear burden effect of the power supply.

FIG. 3E shows current J4 into voltage-limiting circuit 13.

FIG. 3F shows charging current J5 flowing to unregulated voltage bus V4.

FIG. 3G shows the voltages on unregulated voltage bus V4, positive regulated voltage bus VS, and negative regulated voltage bus V6 (these are all relative to common bus V0).

FIG. 3H shows the voltage signal on conductor V1 (the voltage across resistor R1). This is proportional to input current J2 (FIG. 3B).

FIG. 3I shows the voltage signal on conductor V9 (the amplifier input signal). This is the same waveform as FIG. 3H, since resistor R2 has very little effect on the input voltage during normal operation.

Figure 4:
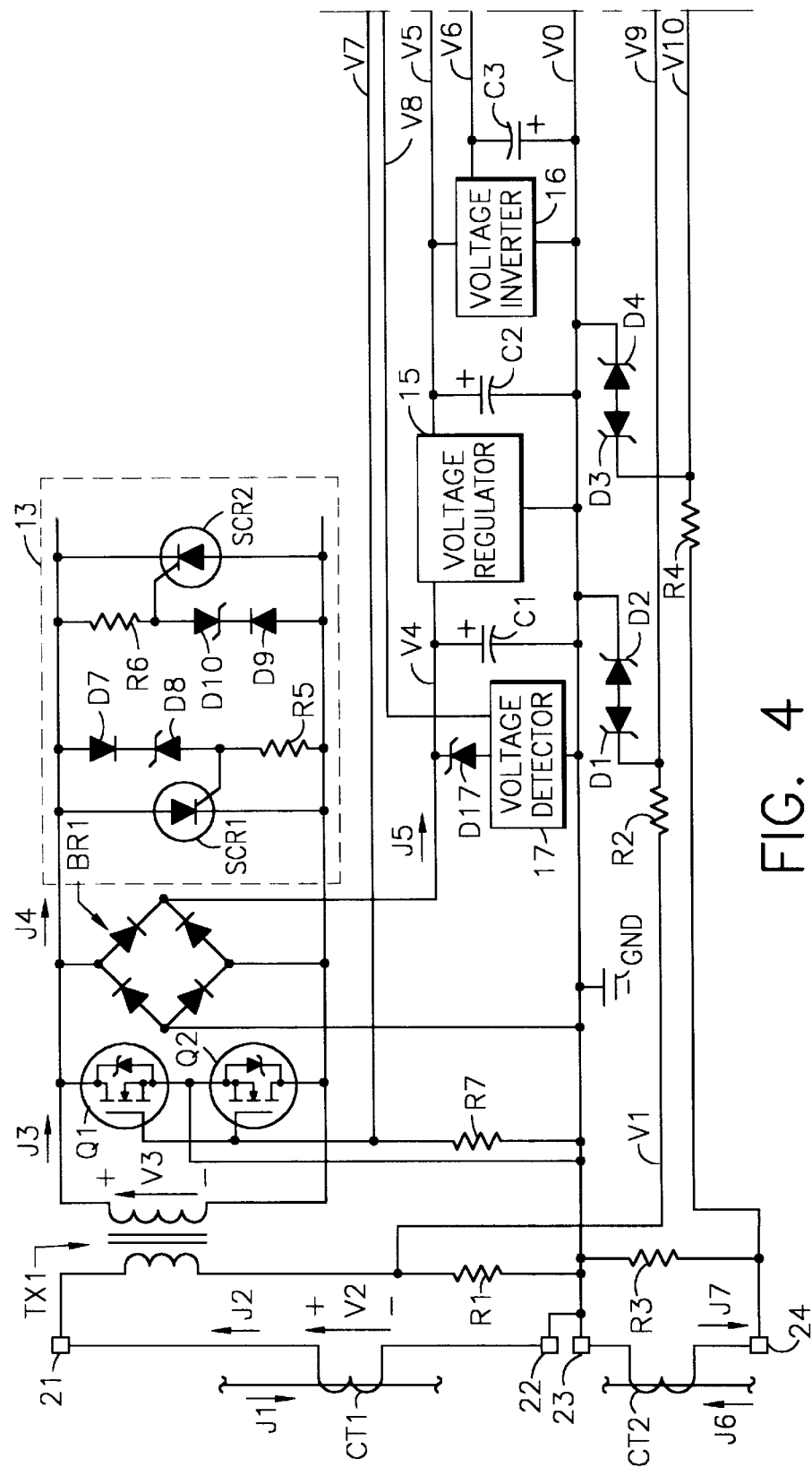
FIG. 4 shows a power supply and current-sensing configuration similar to FIG. 2A, except that a burden-reducing circuit has been added to reduce the power supply burden effect while sensing input current.

FIG. 4 shows a power supply and current-sensing configuration similar to FIG. 2A, except that a burden-reducing circuit has been added in the form of field-effect transistors Q1 and Q2 and resistor R7. Field-effect transistors Q1 and Q2 are enhancement-mode devices that act like open circuits when gate-to-source voltage is near zero, and start conducting as gate-to-source voltage is increased. The devices used have very low on-state drain-to-source resistance to reduce the power supply burden effect during sensing of input current J2. Additionally, the devices chosen have sensitive gates for operation at low voltage levels (approximately five volts). They are configured to function as an electronic switch.

When the burden-reducing control signal on conductor V7 is low (near zero volts), field-effect transistors Q1 and Q2 are not active, and operation is similar to that of FIG. 2A. When the burden-reducing control signal on conductor V7 is high, field-effect transistors Q1 and Q2 are switched on (in saturation), and secondary current J3 is shunted through field-effect transistors Q1 and Q2. The circuit connected to the secondary of internal transformer TX1 becomes a very low resistance. This resistance is the sum of the on-state resistances of field-effect transistors Q1 and Q2. This resistance (plus winding resistance) appears from the primary side of the transformer to be even smaller, by a factor that is the square of the turns ratio of internal transformer TX1. This sharply reduces the burden effect of the power supply circuit on the secondary of current transformer CT2.

Resistor R7 is included to provide a discharge path for charge on the gates of field-effect transistors Q1 and Q2 when the burden-reducing control signal on conductor V7 goes low.

FIGS. 5A through 5I illustrate typical operating waveforms of the power supply and current-sensing configuration shown in FIG. 4. Operation prior to time T4 is similar to FIGS. 3A through 3I. The present discussion will focus on waveforms that are different from previous discussions. Similar to previous figures, the waveform magnitudes are normalized for clarity of illustration.

Figure 5:
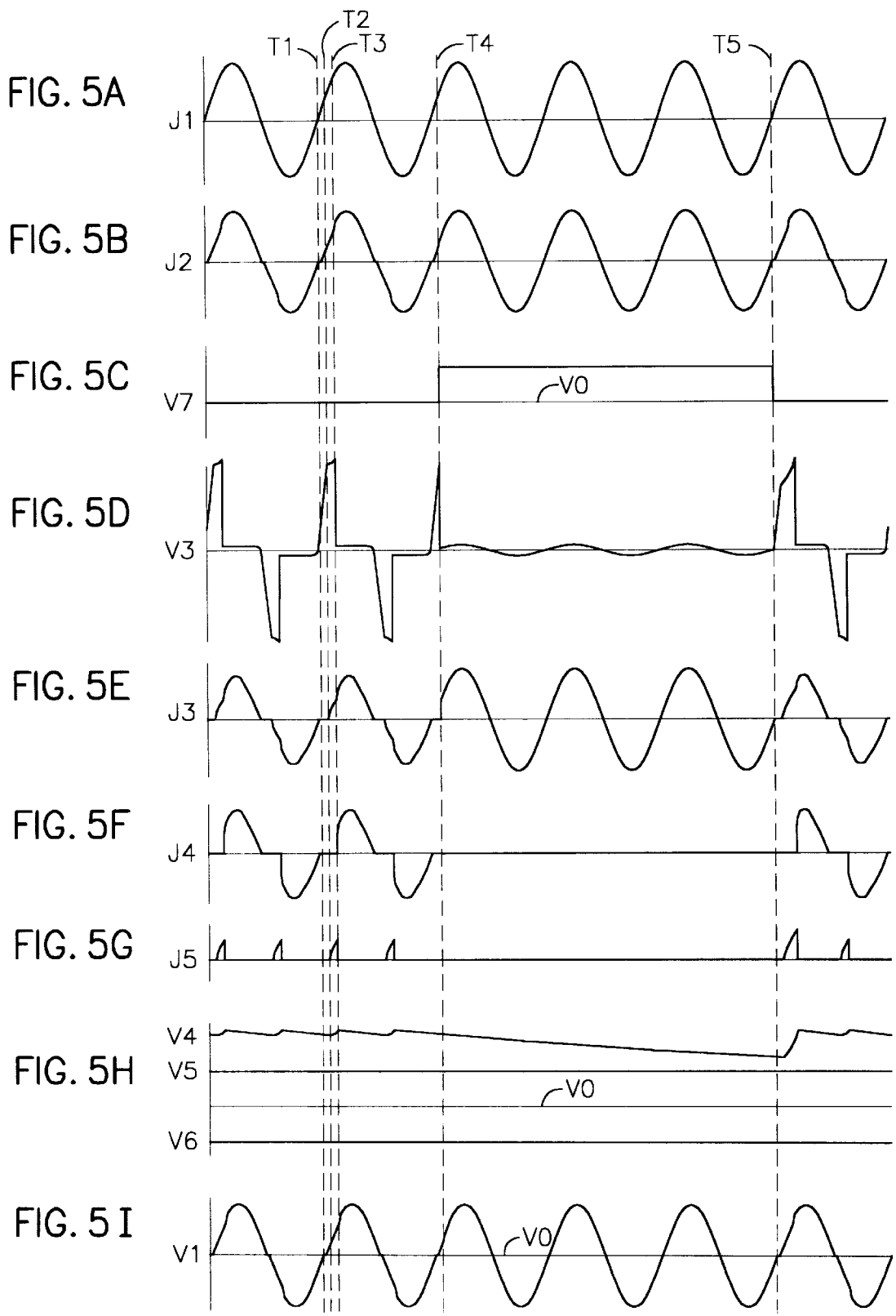
FIGS. 5A through 5I show typical operating waveforms associated with the power supply and current-sensing configuration of FIG. 4.

FIG. 5A shows a typical waveform for a-c system current J1 (the same as FIG. 3A).

FIG. 5B shows input current J2, which is the current generated by current transformer CT1. This now shows some distortion when compared to J1, as it is now assumed that current transformer CT1 is adversely affected by the burden effect of the power supply in the secondary circuit.

FIG. 5C shows the burden-reducing control signal on conductor V7. At time T4, the microprocessor drives this voltage signal high to actuate the burden-reducing circuit to begin accurately sensing input current J2. The burden-reducing control signal remains high until the microprocessor turns it off at time T5, at which time the power supply resumes its normal charging cycle.

FIG. 5D shows internal transformer TX1 secondary voltage V3. The charging pulses are seen to stop while the burden-reducing control signal on conductor V7 is high between times T4 and T5. During this time, current J3 is shunted through field-effect transistors Q1 and Q2. Secondary voltage V3 between times T4 and T5 is just the voltage caused by current J3 through the on-state resistance of field-effect transistors Q1 and Q2.

The voltage across the primary of internal transformer TX1 is similar to secondary voltage V3, but it is reduced by the turns ratio. There will also be some additional sinusoidal voltage on the primary side of internal transformer TX1 caused by the resistance of the primary and secondary windings of internal transformer TX1.

FIG. 5E shows internal transformer TX1 secondary current J3. The distortion due to the nonlinear burden effect of the power supply charging cycle is seen to stop between times T4 and T5 while the burden-reducing circuit is actuated.

FIG. 5F shows the current into voltage-limiting circuit 13. Voltage-limiting circuit 13 is seen to be inactive while the burden-reducing circuit is actuated between times T4 and T5.

FIG. 5G shows charging current J5 flowing to unregulated voltage bus V4. Charging current J5 is seen to stop while the burden-reducing circuit is actuated between times T4 and T5.

FIG. 5H shows the voltages on unregulated voltage bus V4, positive regulated voltage bus V5, and negative regulated voltage bus V6 (these voltages are all relative to common bus V0). The voltage on unregulated voltage bus V4 is seen to decrease significantly while the burden-reducing circuit is actuated between times T4 and T5. This illustrates how capacitor C1 contributes stored energy to voltage regulator 15 to maintain regulated voltage output while the burden-reducing circuit is actuated between times T4 and T5.

FIG. 5I shows the voltage signal on conductor V1 (the voltage across resistor R1). Signal distortion is seen to be reduced while the burden-reducing circuit is actuated between times T4 and T5.

Figure 6:
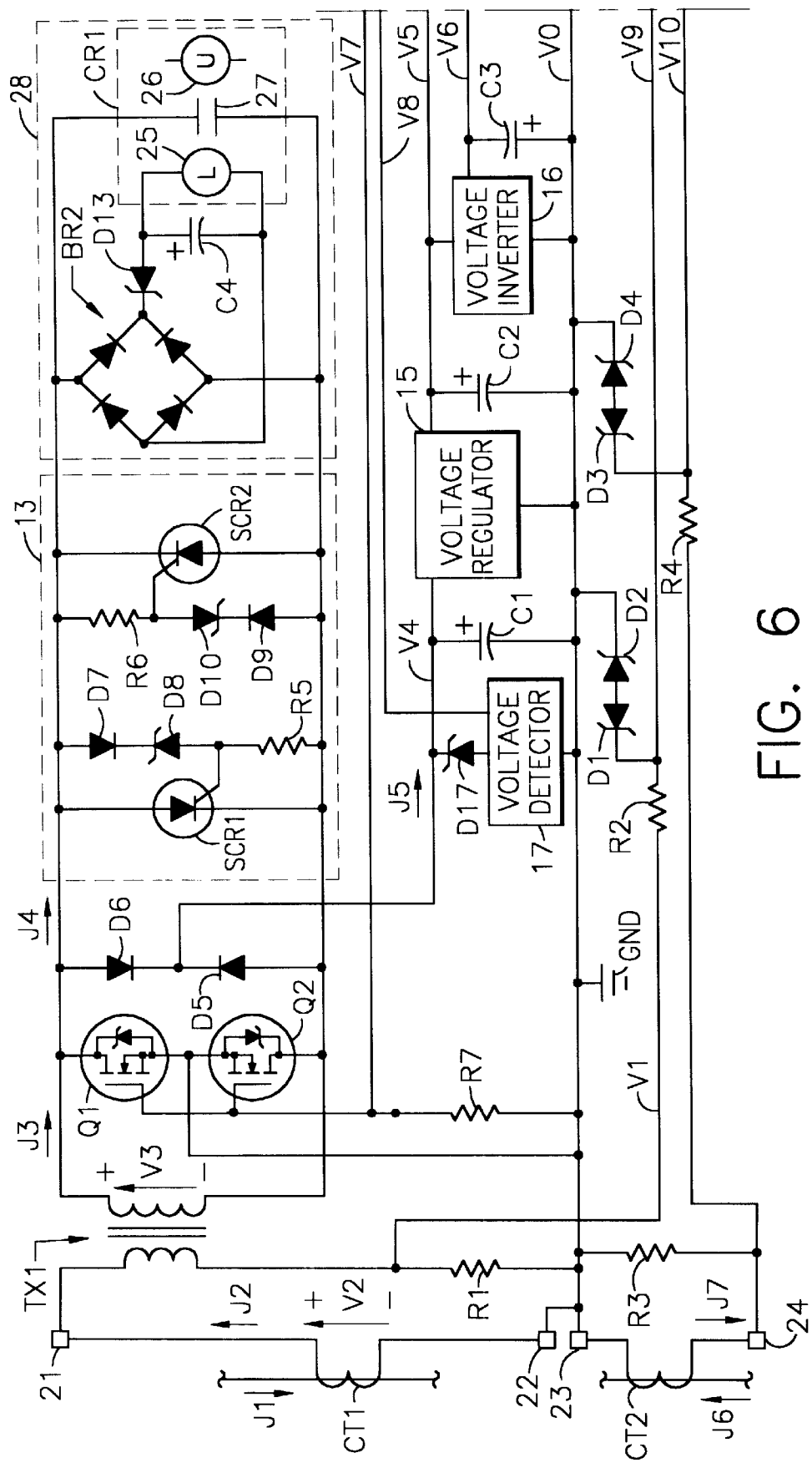
FIG. 6 shows a power supply and current-sensing configuration similar to FIG. 4, except that the burden-reducing circuit has been integrated with the rectifier circuit to reduce the number of components required. Also, a failure protection circuit has been added to shut down the power supply in the event the voltage-limiting circuit fails.

FIG. 6 shows a power supply and current-sensing configuration similar to FIG. 4, except that the burden-reducing circuit has been integrated with the rectifier circuit to reduce the number of components. Also, a failure protection circuit 28 has been added to shut down the power supply in the event of a failure of voltage-limiting circuit 13.

Field-effect transistors typically have an integral "drain-source diode" that conducts reverse bias currents (from source to drain). This diode is shown in the symbol for field-effect transistors Q1 and Q2. These diodes integral to field-effect transistors Q1 and Q2 may be used in place of two of the diodes integral to full-wave bridge rectifier BR1 (shown in FIG. 4). Therefore, the function of full-wave bridge rectifier BR1 (shown in FIG. 4) may be accomplished with field-effect transistors Q1 and Q2 along with two additional diodes DS and D6 as shown in FIG. 6. The operation of FIG. 6 is basically the same as FIG. 4 except for how the full-wave bridge rectifier function is configured.

The failure protection circuit 28 shown in FIG. 6 has no effect on operation under normal operating conditions. However, if there is a failure of voltage-limiting circuit 13, the charging voltage peaks of secondary voltage V3 will increase and activate failure protection circuit 28. As secondary voltage V3 increases past the reverse breakdown voltage of zener diode D13, full-wave bridge rectifier BR2 conducts current to charge capacitor C4. When the charge on this capacitor reaches a predetermined level, the latching coil 25 of control relay CR1 closes control relay contact 27. The closure of contact 27 safely short-circuits the secondary winding of internal transformer TX1, thus disabling the power supply. The power supply remains disabled until the failure is repaired and unlatch coil 26 is energized by external means.

Figure 7:
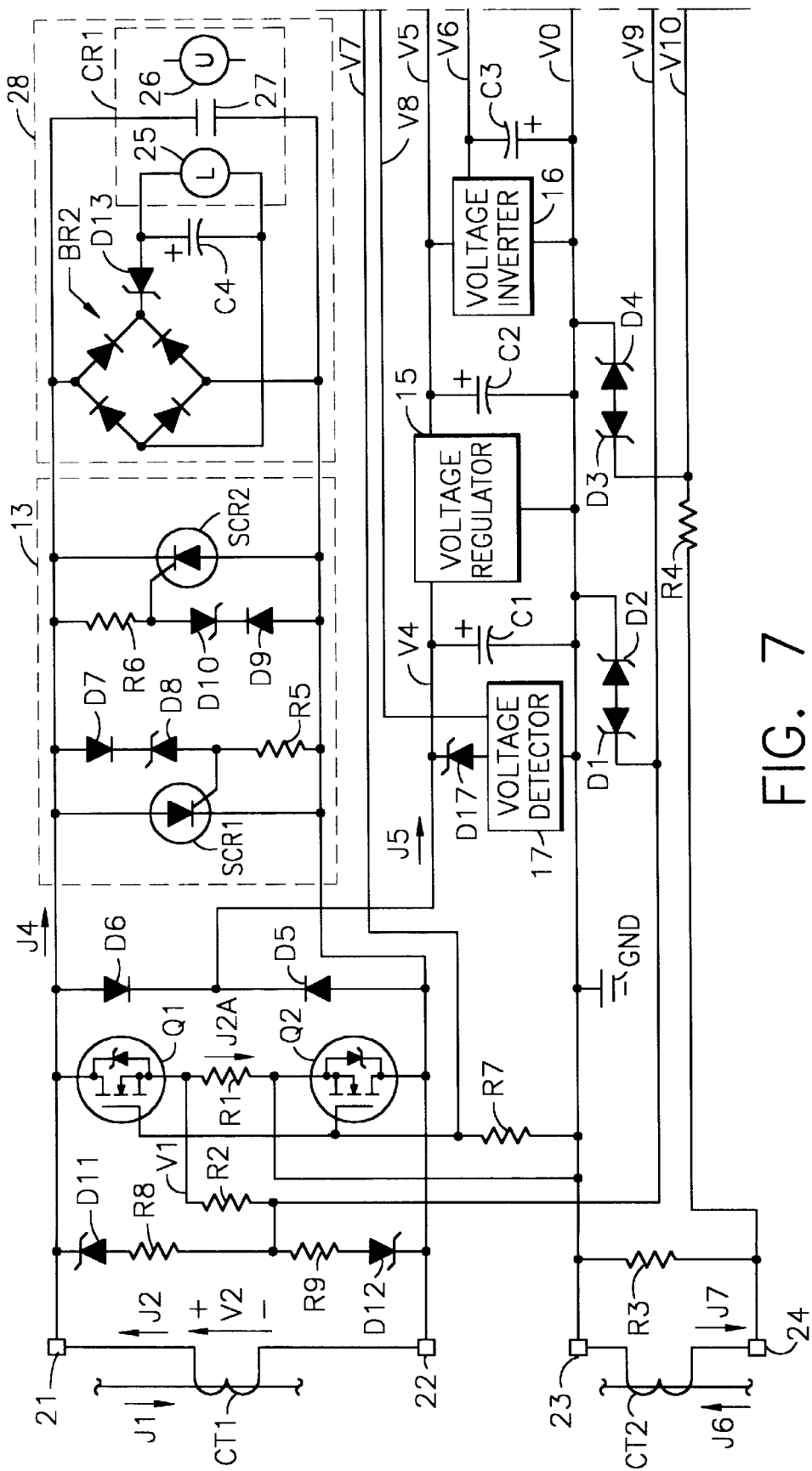
FIG. 7 shows a power supply and current-sensing configuration that requires no internal transformer, with a burden-reducing circuit included. Current is only sensed while the burden-reducing circuit is actuated.

FIG. 7 illustrates a power supply and current-sensing configuration with no internal transformer. Operation is similar to FIG. 6, except that sensing resistor R1 has been connected between field-effect transistors Q1 and Q2 to sense input current. Input current J2 flows through sensing resistor R1 only while the burden-reducing circuit is actuated. The resistance of resistor R1 is small, so that the voltage signal across resistor R1 does not significantly reduce the gate-source voltage of field-effect transistor Q1 when the gate voltage on conductor V7 is high.

Since current transformer CT1 must generate the fill power supply charging voltage as configured in FIG. 7, secondary current J2 is subject to greater distortion than previous configurations. While this configuration will work with most standard current transformers, operation is better with current transformers that have a large number of secondary winding turns. The preferred embodiment utilizes external current transformers with secondary ratings of only one amp rather than five amps. This increases the number of secondary winding turns by a factor of five. For current transformers with similar cores, the ability of the current transformer to generate secondary voltage is also increased by a factor of five.

Because of the relatively high sustained secondary voltages that current transformer CT1 must generate, there is a tendency for current transformer CTF1 to operate at or near magnetic saturation of the core. This can affect the accuracy of secondary current J2 even while the burden-reducing circuit is actuated. To minimize this problem, the burden-reducing circuit should be actuated when the magnetic core of current transformer CT1 is not near saturation. This may be done by actuating the burden-reducing circuit shortly after a power supply charging pulse begins, near a waveform zero crossing. However, since input current J2 only flows through sensing resistor R1 while the burden-reducing circuit is actuated, the microprocessor has no easy way to determine the beginning of a power supply charging pulse or a waveform zero crossing. To solve this problem, resistors R8 and R9 and zener diodes D11 and D12 have been added in FIG. 7. These act to attenuate and conduct the peaks of the charging pulses to the amplifier circuit via conductor V9. These charging pulses are then communicated to the microprocessor via the analog-to-digital converter circuit. This enables the microprocessor to determine the beginning of the power supply charging pulses, and to actuate the burden-reducing circuit at an optimal time.

With the charge pulse sensing circuit (resistors R8 and R9 and zener diodes D11 and D12) included as shown in FIG. 7, it is possible to eliminate voltage detector 17, with the microprocessor verifying power supply charge state from the digital signal provided by the analog-to-digital circuit. The peaks of the charging pulses correlate to the voltage on unregulated voltage bus V4. The added program complexity, however, may not make this change preferable.

FIGS. 8A through 8I illustrate typical operating waveforms of the power supply and current-sensing configuration shown in FIG. 7. Operation is similar to FIGS. 5A through 5I. The present discussion will focus on waveforms that are different from previous discussions. Similar to previous figures, the waveform magnitudes are normalized for clarity of illustration.

Figure 8:
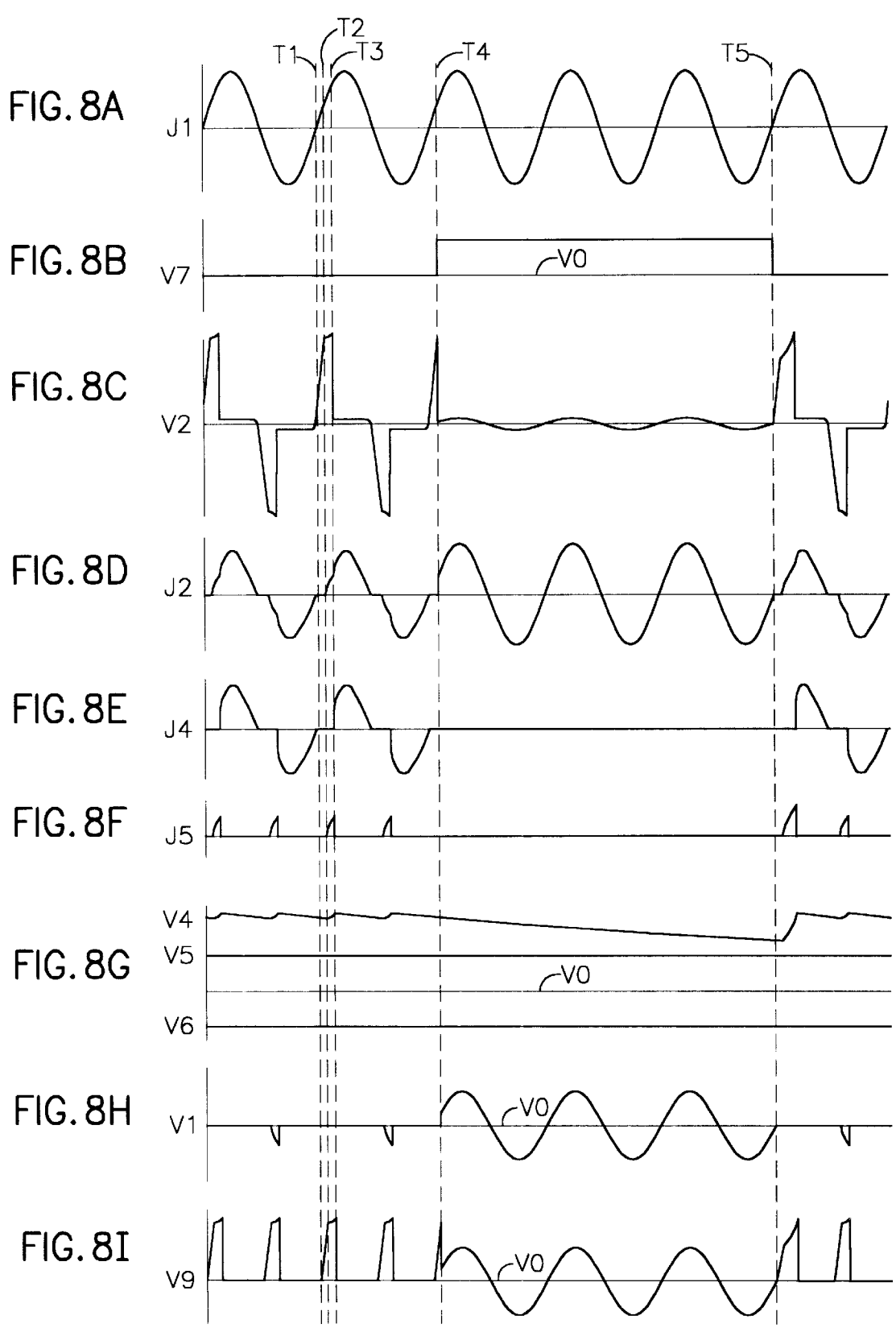
FIGS. 8A through 8I show typical operating waveforms associated with the power supply and current-sensing configuration of FIG. 7.

FIG. 8A shows a typical waveform for a-c system current J1 (the same as FIGS. 3A and 5A).

FIG. 8B shows the burden-reducing control signal on conductor V7, similar to FIG. 5C. At time T4, the microprocessor drives this voltage signal high to actuate the burden-reducing circuit to begin accurately sensing input current J2. The burden-reducing control signal remains high until the microprocessor turns it off at time T5, at which time the power supply resumes its normal charging cycle.

FIG. 8C shows current transformer CT1 secondary voltage V2. This waveform is similar to internal transformer TX1 secondary voltage V3 in FIG. 5D. The charging pulses are seen to stop while the burden-reducing control signal V7 is high between times T4 and TS. During this time, current J2 is shunted through field-effect transistors Q1 and Q2. Secondary voltage V2, between times T4 and T5, is just the voltage caused by input current J2 through resistor R1 plus the on-state resistances of field-effect transistors Q1 and Q2.

FIG. 8D shows input current J2, which is the secondary current generated by current transformer CT1. This now shows considerable distortion when compared to J1, as it is now assumed that current transformer CT1 is seriously affected by the burden effect of the power supply in the secondary circuit. The distortion due to the nonlinear burden effect of the power supply is seen to stop between times T4 and T5 while the burden-reducing circuit is actuated.

FIG. 8E shows the current into the voltage-limiting circuit 13 (similar to FIG. 5F). The voltage-limiting circuit 13 is seen to be inactive while the burden-reducing circuit is actuated between times T4 and T5.

FIG. 8F shows charging current J5 flowing to unregulated voltage bus V4 (similar to FIG. 5G). The charging current is seen to stop while the burden-reducing circuit is actuated between times T4 and T5.

FIG. 8G shows the voltages on unregulated voltage bus V4, positive regulated voltage bus V5, and negative regulated voltage bus V6 (these voltages are all relative to common bus V0). Waveforms are similar to FIG. 5H.

FIG. 8H shows the voltage signal on conductor V1 (the voltage across resistor R1). Input current J2 is seen to flow through resistor R1 only while the burden-reducing circuit is actuated. The small pulses before time T4 and after time T5 are caused by the charging current pulses that pass through the internal diode of field-effect transistor Q1.

FIG. 8I shows the voltage signal on conductor V9 that is input to the amplifier circuit.

Between times T4 and T5 this is the same as the voltage signal on conductor V1 (FIG. 8H). Before time T4 and after time T5 the peaks of the power supply charging pulses are present due to the addition of zener diodes D11 and D12 and resistors R8 and R9 (as discussed above for FIG. 7).

Figure 9:
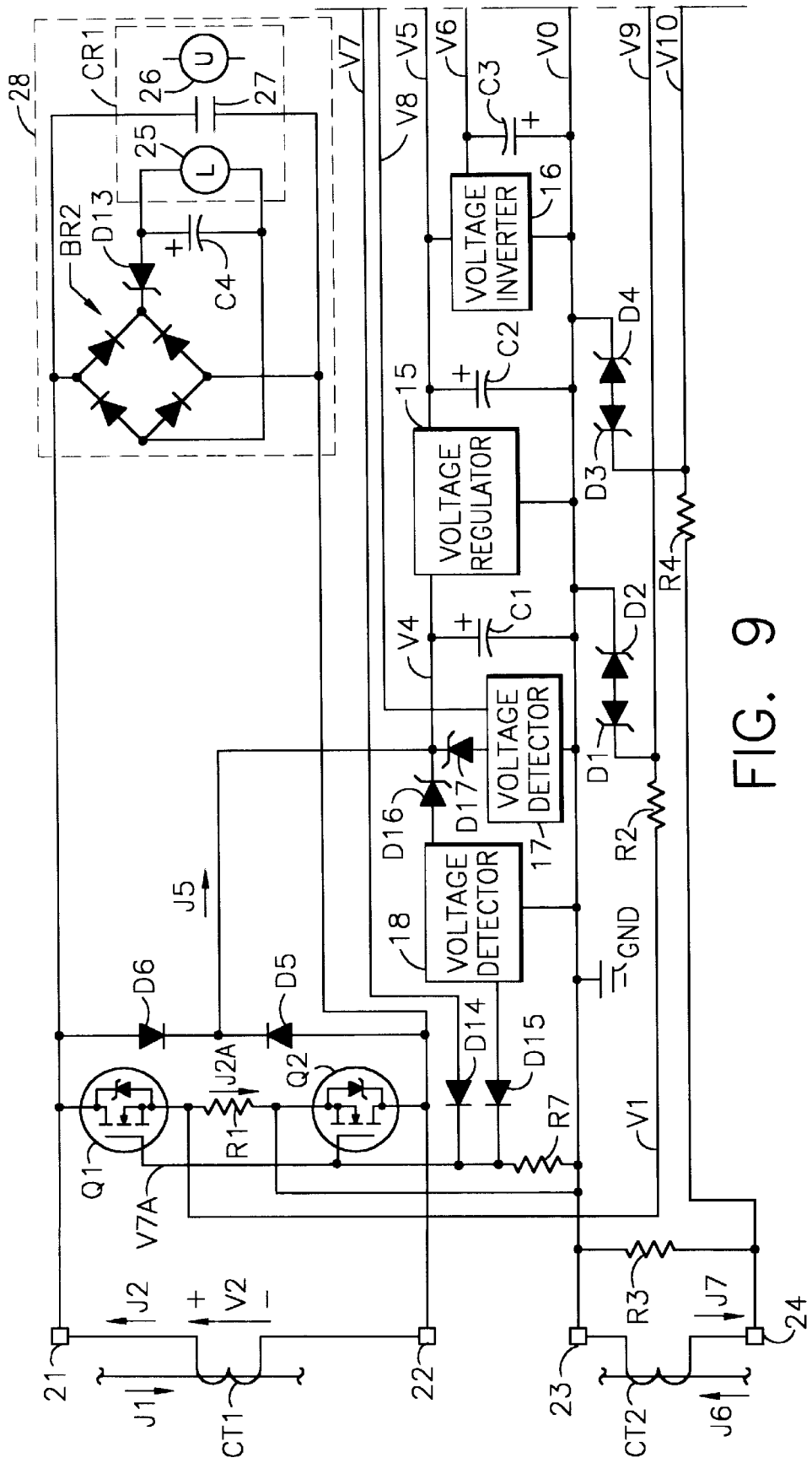
FIG. 9 shows a power supply and current-sensing configuration similar to FIG. 7, except that the voltage-limiting circuit has been integrated into the burden-reducing circuit. This circuit can be used to monitor d-c input currents as well as a-c input currents.

FIG. 9 shows a power supply and current-sensing configuration similar to FIG. 7, except that the voltage-limiting circuit has been integrated into the burden-reducing circuit. Field-effect transistors Q1 and Q2 are now used to shunt the excess of current J2 to limit voltage instead of silicon-controlled rectifiers SCR1 and SCR2 (as shown in FIG. 7). Voltage detector circuit 18 and zener diode D16 have been added to control field-effect transistors Q1 and Q2 in such a way as to limit secondary voltage V2. As the voltage on unregulated voltage bus V4 increases, voltage detector circuit 18 toggles its output high to turn on field-effect transistors Q1 and Q2 and thereby shunt the excess of current J2 so that charging of capacitor C1 stops. The output of voltage detector 18 remains high until the voltage on unregulated voltage bus V4 decreases to a level that causes the output to toggle low again and repeat the cycle. Diodes D14 and D15 have been added to facilitate paralleling the control signals from the microprocessor and voltage detector 18. Three-terminal voltage detectors are commonly available in ratings from approximately two to six volts. Zener diode D16 is included to raise the effective detected voltage to a level higher than six volts. A detailed description of voltage detector circuit 18 is not included herein since it involves only prior art.

The main advantage of the power supply and current-sensing configuration shown in FIG. 9 over those shown previously is that the configuration shown in FIG. 9 can derive power from a d-c input current as well as an a-c input current. If input current is only d-c current, the rectifying and burden-reducing circuit may be simplified (replace field-effect transistor Q2 and diode D6 with conductors, and remove diode D5). Failure protection circuit 28 may also be simplified if input current is only d-c current.

FIGS. 10A through 10I illustrate typical operating waveforms of the power supply and current-sensing configuration shown in FIG. 9. Operation is similar to FIGS. 8A through 8I. The present discussion will focus on waveforms that are different from previous discussions. Similar to previous figures, the waveform magnitudes are normalized for clarity of illustration.

Figure 10:
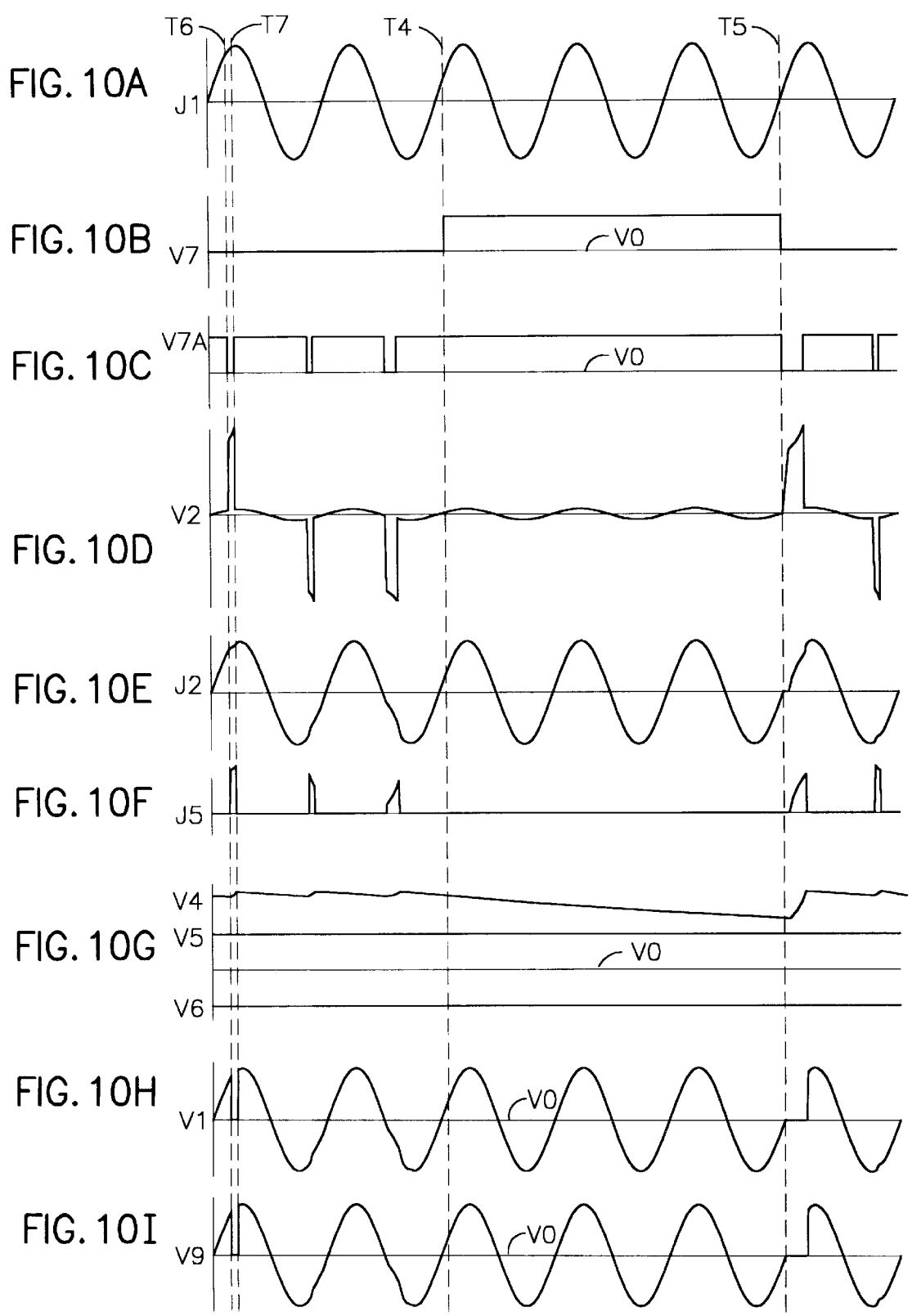
FIGS. 10A through 10I show typical operating waveforms associated with the power supply and current-sensing configuration of FIG. 9.

FIG. 10A shows a typical waveform for a-c system current J1 (the same as FIGS. 3A, 5A, and 8A).

FIG. 10B shows the burden-reducing control signal on conductor V7, similar to FIGS. 5C and 8B. At time T4, the microprocessor drives this voltage signal high to actuate the burden-reducing circuit to begin accurately sensing input current J2. The burden-reducing control signal remains high until the microprocessor turns it off at time T5, at which time the power supply resumes its normal charging cycle.

FIG. 10C shows the gate control voltage signal on conductor V7A. The signal on this conductor is a combination of the burden-reducing control signal from the microprocessor (per FIG. 10B) and the voltage-limiting control signal from voltage detector 18. Prior to time T4 and after time T5 the signal shown is generated by voltage detector 18. At time T6 the output from voltage detector 18 goes low in response to low voltage on unregulated voltage bus V4 (see FIG. 10G). At time T7 the output from voltage detector 18 goes high in response to the voltage on unregulated voltage bus V4 being restored to an acceptable level. This charging cycle pattern is seen to repeat at regular intervals. This repeat interval is determined primarily by the hysteresis voltage of voltage detector 18, the size of capacitor C1, and the level of current required by voltage regulator 15.

FIG. 10D shows current transformer CT1 secondary voltage V2. This waveform is similar to FIG. 8C, except that the charging pulses no longer occur uniformly at the beginning of each half-cycle. The charging pulses occur somewhat randomly whenever voltage detector 18 senses low voltage on unregulated voltage bus V4.

FIG. 10E shows input current J2, which is the current generated by current transformer CT1. This waveform is similar to FIG. 8D, except that the distortion caused by charging pulses is no longer uniformly at the beginning of each half-cycle. The distortion caused by the charging pulses now occurs somewhat randomly whenever voltage detector 18 senses low voltage on unregulated voltage bus V4.

FIG. 10F shows charging current J5 flowing to unregulated voltage bus V4. This is similar to FIG. 8F, except that charging pulses no longer occur uniformly each half cycle. Each charging pulse is somewhat unique, depending on which part of the cycle of current J2 the charging pulse occurs.

FIG. 10G shows the voltages on unregulated voltage bus V4, positive regulated voltage bus V5, and negative regulated voltage bus V6 (these are all relative to common bus V0). These waveforms are similar to FIG. 8G, except that the charging cycle on unregulated voltage bus V4 no longer occurs uniformly at every half-cycle of input current J2. FIG. 10H shows the voltage signal on conductor V1 (the voltage across resistor R1). This voltage waveform is seen to be nearly the same as the waveform for input current J2. It is slightly different, however, since the power supply charging current pulses do not flow through resistor R1 during positive half-cycles of current J2. This is the case between times T6 and T7 (and immediately after time T5) when the voltage on conductor V1 is zero while current J2 is not zero. The voltage signal on conductor V1 is not affected by this difference between times T5 and T6 while the burden-reducing circuit is actuated.

FIG. 10I shows the voltage signal on conductor V9 that is input to the amplifier circuit. This is the same as the waveform shown in FIG. 10H, since resistor R2 has almost no effect on the voltage signal during normal operating conditions.

Due to the irregular charging cycles inherent in the power supply and current-sensing configuration shown in FIG. 9, current transformer CT1 is more affected by core saturation effects than with the power supply and current-sensing configuration shown in FIG. 7. For this reason, the power supply and current-sensing configuration shown in FIG. 7 is preferred to the configuration shown in FIG. 9 for a-c input currents. However, the configuration shown in FIG. 9 is preferred for d-c input currents.

Figure 11:
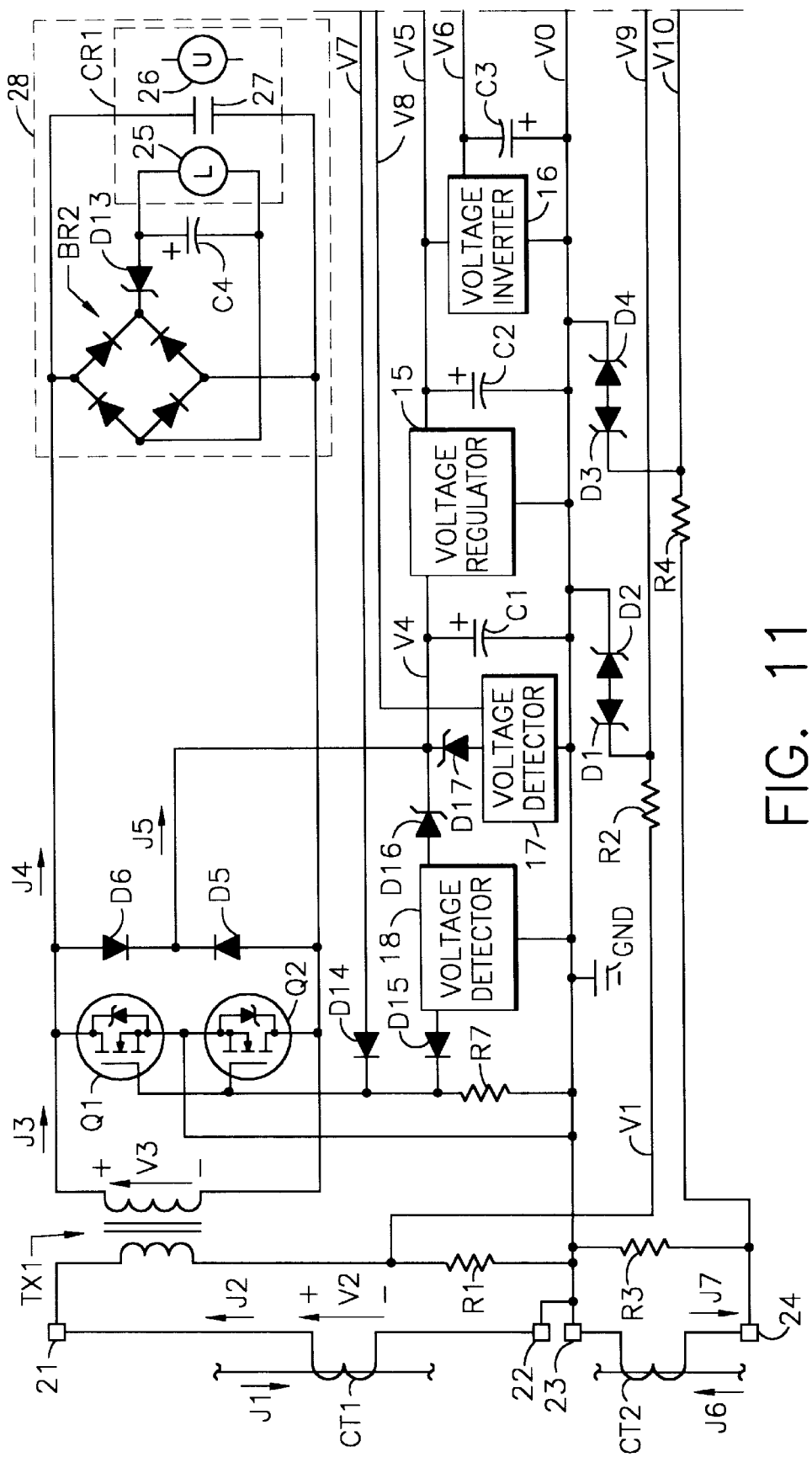
FIG. 11 shows a power supply and current-sensing configuration similar to FIG. 9, except that an internal transformer has been added to facilitate operation with input currents derived from standard current transformers.

FIG. 11 shows a power supply and current-sensing configuration similar to FIG. 9, except that internal transformer TX1 has been added again. Similar to FIGS. 2A, 4, and 6, internal transformer TX1 provides a better match between the output characteristics of current transformer CT1 and the input requirements of the power supply. This especially facilitates power supply operation when current transformer CT1 is a standard unit with relatively few secondary winding turns. The location of resistor R1 is similar to FIGS. 2A, 4 and 6.

While the configuration of FIG. 9 can be used to derive power from d-c input current, the configuration shown in FIG. 11 cannot be used with d-c input current, since the internal transformer can only operate properly with a-c current.

Figure 12:
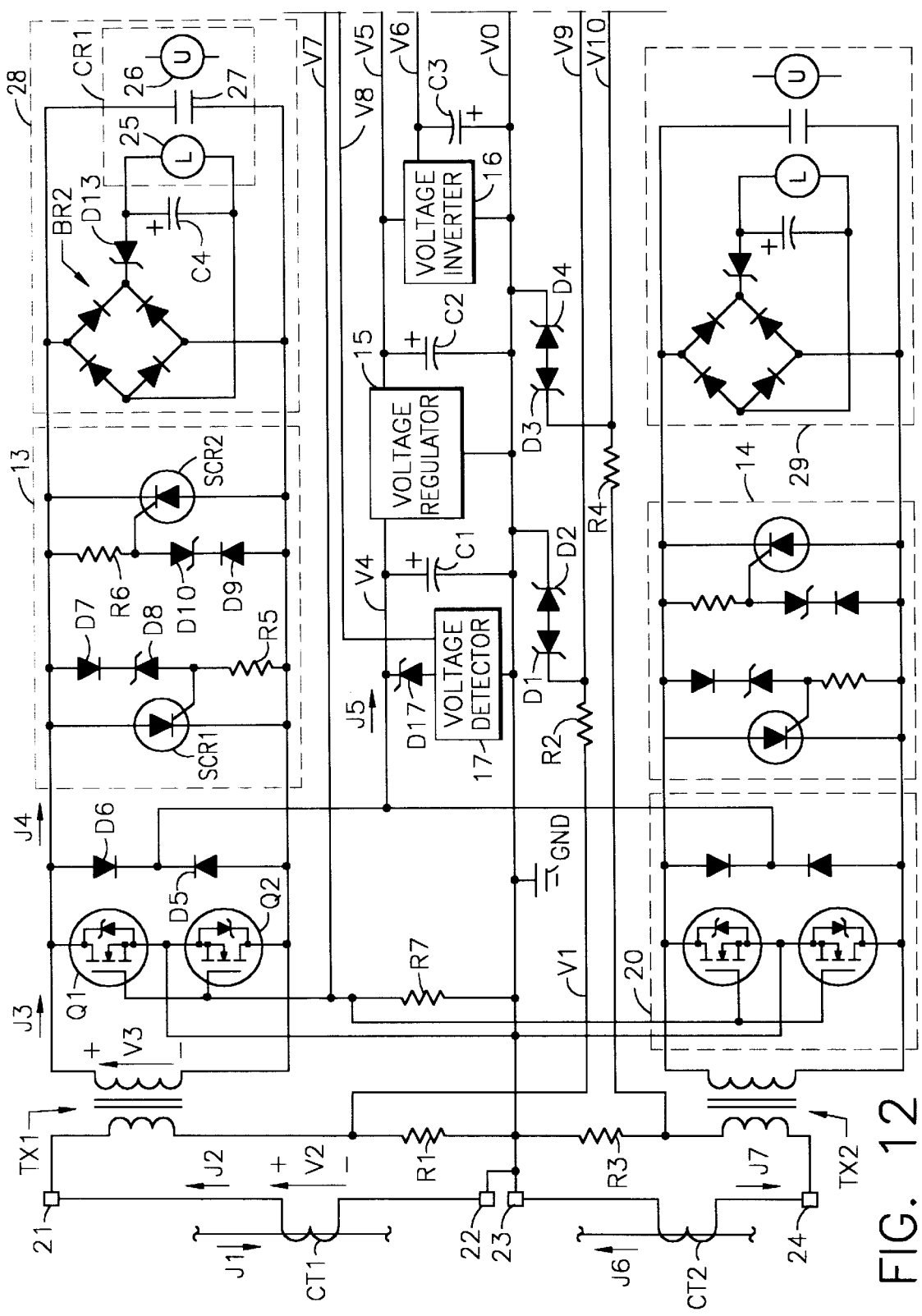
FIG. 12 shows a power supply and current-sensing configuration similar to FIG. 6 (with an internal transformer), except that the power supply is now configured to derive operating power from two input currents.

FIG. 12 shows a power supply and current-sensing configuration similar to FIG. 6, except that the power supply has been configured to derive power from input current J7 in addition to input current J2. This provides power for operation of the current monitor during times when input current J2 is not large enough to charge the power supply. Any number of inputs may be configured in a similar way to provide charging power to the power supply circuit.

Operation of FIG. 12 is similar to FIG. 6 except that charging current J5 may be derived from both input current J2 and input current J7. Internal transformer TX2 functions to provide charging current to the power supply in a similar manner as internal transformer TX1. Voltage-limiting circuit 14 functions to limit the secondary voltage of internal transformer TX2 in the same manner that voltage-limiting circuit 13 functions to limit the secondary voltage of internal transformer TX1. Failure protection circuit 29 protects against a failure of voltage-limiting circuit 14 in the same manner that failure protection circuit 28 protects against a failure of voltage-limiting circuit 13. Rectifying and burden-reducing circuit 20 functions in a similar manner for input current J7 as field-effect transistors Q1 and Q2 and diodes D5 and D6 function for input current J2.

Figure 13:
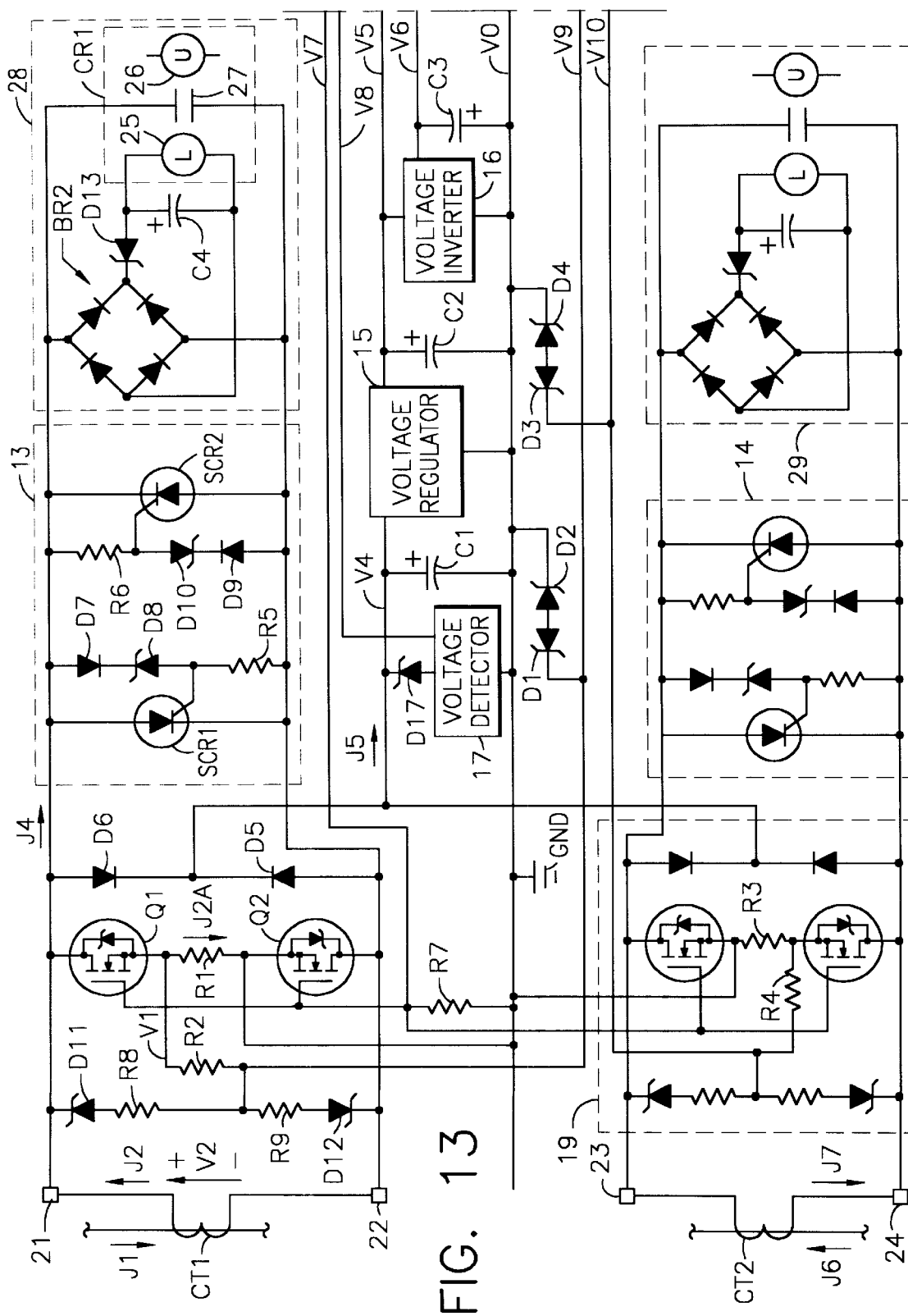
FIG. 13 shows a power supply and current-sensing configuration similar to FIG. 7 (no internal transformer), except that the power supply is now configured to derive operating power from two input currents.

FIG. 13 shows a power supply and current-sensing configuration similar to FIG. 7, except that the power supply has been configured to derive power from input current J7 in addition to input current J2 (similar to FIG. 12). This provides power for operation of the current monitor during times when input current J2 is not large enough to charge the power supply. Any number of inputs may be configured in a similar way to provide charging power to the power supply circuit.

Operation of FIG. 13 is similar to FIG. 7 except that charging current J5 may be derived from both input current J2 and input current J7. Voltage-limiting circuit 14 functions to limit the secondary voltage of current transformer CT2 in the same manner that voltage-limiting circuit 13 functions to limit the secondary voltage of current transformer CT1. Failure protection circuit 29 protects against a failure of voltage-limiting circuit 14 in the same manner that failure protection circuit 28 protects against a failure of voltage-limiting circuit 13. Rectifying, burden-reducing, and current-sensing circuit 19 functions in a similar manner for input current J7 as the equivalent circuit (comprising field-effect transistors Q1 and Q2, diodes D5 and D6, zener diodes D11 and D12, and resistors R1, R2, R8 and R9) functions for input current J2.

A single burden-reducing control conductor (V7) is shown in FIGS. 12 and 13 to control the burden-reducing function for both input currents. The burden-reducing function could be separately controlled for each input current with separate signals from the microprocessor. Similarly, the burden-reducing function could be controlled separately or together for any number of inputs (if the microprocessor has an adequate number of outputs available for individual control).

Figure 14:
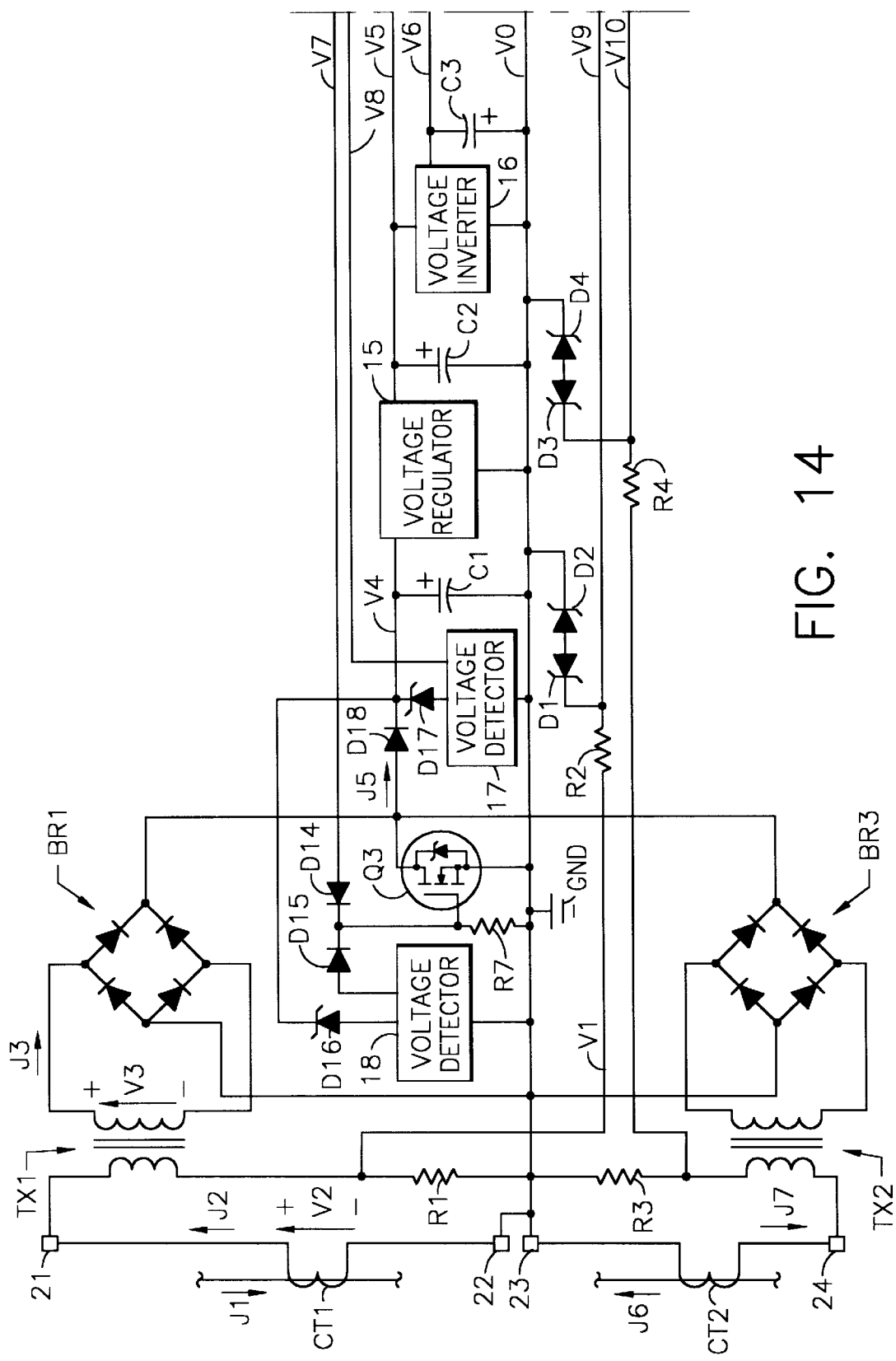
FIG. 14 shows a power supply and current-sensing configuration similar to FIG. 11 except that the voltage-limiting circuit and burden-reducing circuit are connected to the unregulated d-c voltage bus rather than to the secondary winding of the internal transformer. Operating power is derived from two input currents similar to FIG. 12.

FIG. 14 shows a power supply and current-sensing configuration similar to FIG. 11, except that the voltage-limiting and burden-reducing switching function has been relocated to the unregulated d-c voltage side of the rectifier circuit and power is now derived from both input currents rather than just one. Also, failure protection circuit 28 shown in FIG. 11 has been omitted.

The configuration shown in FIG. 14 derives power from two input currents similar to FIG. 12, but the number of components used is greatly reduced. Any number of inputs may be configured in a similar way to provide charging power to the power supply circuit.

In the configuration shown in FIG. 14, standard bridge rectifiers BR1 and BR2 each rectify one input current. Both bridge rectifiers BR1 and BR2 provide rectified current to charge capacitor C1. Diode D18 is included in the rectified current path to prevent discharge of capacitor C1 when field-effect transistor Q3 is actuated.

A single field-effect transistor Q3 is utilized in FIG. 14 to limit voltage on charging capacitor C1 and reduce the burden effect for both input currents. Diodes D14 and D15, zener diode D16, voltage detector 18, and resistor R7 function to control field-effect transistor Q3 in the same way they function in FIG. 11 to control field-effect transistors Q1 and Q2.

Field-effect transistor Q3 must be rated for the sum of the currents from the secondary windings of all internal transformers, and diode D18 must have a similar rating since it also conducts the sum of all these currents (though not continuously).

The burden-reducing function of the configuration shown in FIG. 14 is adversely affected by leaving the rectifier circuits in the current paths while the burden-reducing function is actuated. The voltage drops of forward-biased diode junctions in the bridge rectifiers result in additional burden on the input current source when compared to the configuration of FIG. 12. Also, with the configuration shown in FIG. 14 there is no way to selectively reduce the burden on individual input currents (burden-reduction must be actuated for all input currents simultaneously).

Another disadvantage of the configuration shown in FIG. 14 is that the rectifier circuits must be rated for higher continuous currents, and additional heat will be generated in the rectifier circuits by these higher currents.

The configuration shown in FIG. 14 may be preferred to that shown in FIG. 12 for deriving power from multiple inputs when cost is the primary consideration. However, the configuration shown in FIG. 12 is preferred to that shown in FIG. 14 when accuracy and reliability are more important than cost.

Figure 15:
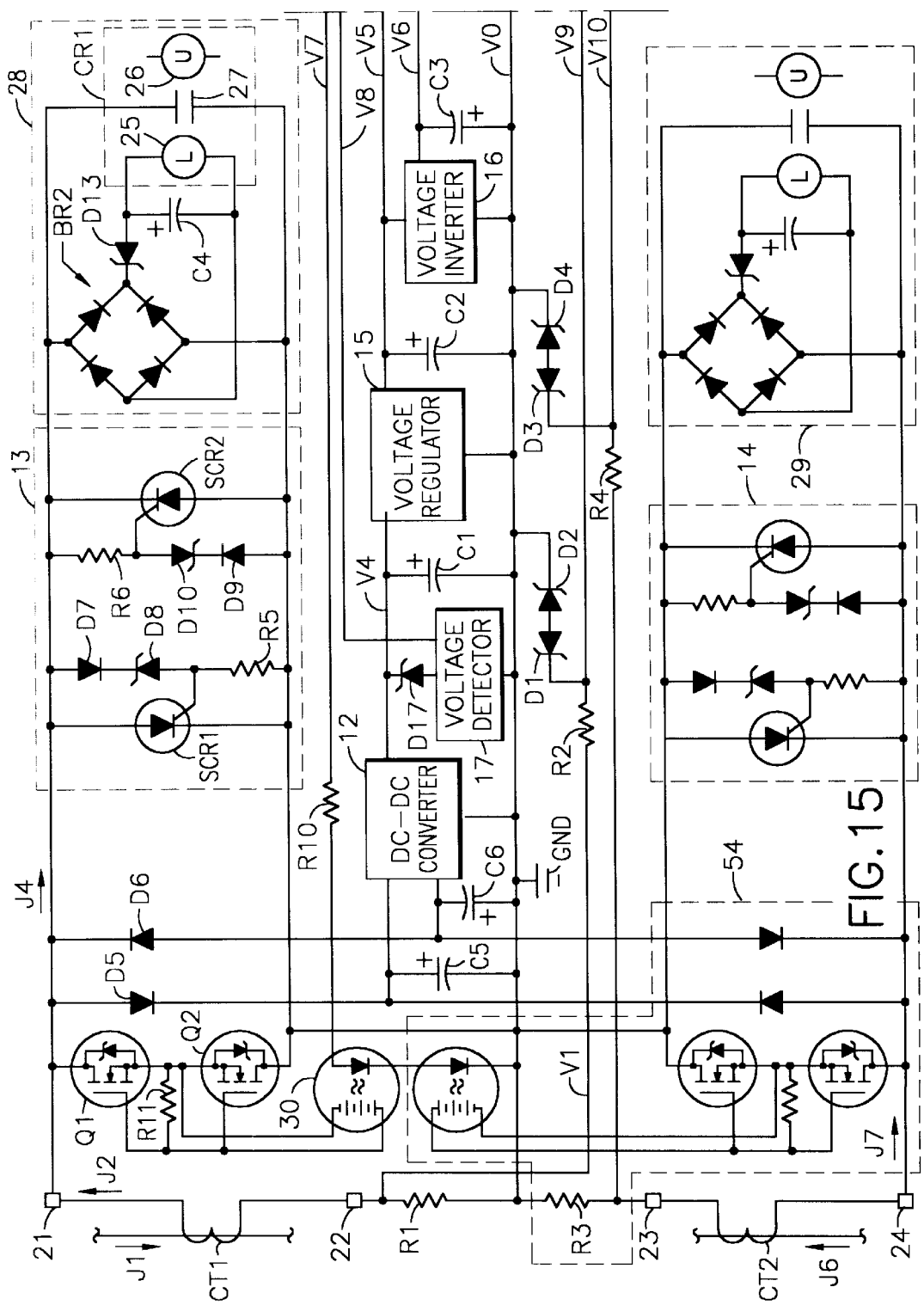
FIG. 15 shows a power supply and current-sensing configuration, without an internal transformer, with provision for sensing input current continually whether or not the burden-reducing circuit is actuated. The configuration shown derives power from two input currents.

FIG. 15 shows a power supply and current-sensing configuration, without an internal transformer, with provision to sense input current continually whether or not the burden-reducing circuit is actuated. The power supply is configured to derive power from both input current J2 and input current J7. The present discussion will focus on parts of the configuration that are significantly different from previous configurations.

While previous power supply and current-sensing configurations utilized full-wave bridge rectifier circuits, these are not used here because there is no easy way to separate the a-c side of the bridge rectifier from the d-c power supply common bus V0.

In FIG. 15, capacitor C5 is charged by rectified current derived from the positive half-cycle of input currents J2 and J7 (while the burden-reducing circuit is off). Similarly, capacitor C6 is charged by rectified current derived from the negative half-cycle of input currents J2 and J7. D-c to d-c converter 12 utilizes the charge on capacitors C5 and C6 to provide isolated d-c power to charge capacitor C1.

With this configuration, sensing resistors R1 and R3 are always connected in series with input currents J2 and J7, respectively, without an internal transformer being required for each input current.

The following benefits are realized by utilizing d-c to d-c converter 12 as shown in FIG. 15:

(a) The isolated input of d-c to d-c converter 12 draws current equally from capacitor C5 and capacitor C6 so that charging currents are approximately balanced for each half-cycle of the input currents. This helps avoid magnetic core saturation problems with the external current transformers.

(b) The power supply output maintains a common bus (bus V0) connected to each sensing resistor. This facilitates use of standard amplifier devices and analog-to-digital converter devices.

D-c to d-c converter 12 may be implemented with a standard device, such as a model PP1R512-12 power module manufactured by Lambda Electronics Inc.

The combination of d-c to d-c converter 12, capacitors C1, C2 and C3, voltage regulator 15, and voltage inverter 16 act together as a voltage-regulating circuit that provides regulated d-c power from unregulated voltage provided by a charge-storing circuit comprising capacitors C5 and C6.

There are other ways to implement the voltage-regulating circuit shown in FIG. 15. The configuration shown (utilizing d-c to d-c converter 12, capacitors C1, C2 and C3, voltage regulator 15, and voltage inverter 16) is just one of many configurations possible utilizing prior art. It is not the intent of this disclosure to limit the power supply to the components illustrated.

Similar to previous discussion, field-effect transistors Q1 and Q2 are configured to function as an electronic switch to implement the burden-reducing function of the power supply for input current J2 (input channel one). In the configuration of FIG. 15, however, photovoltaic isolator 30 is used to isolate the gate circuit of field-effect transistors Q1 and Q2 from other circuits. One such photovoltaic isolator that may be used is a model PVI5050 manufactured by International Rectifier. A similar isolated gate circuit is utilized for input current J7 (input channel two).

Resistor R10 is sized to limit the current through the photovoltaic isolators to their design value. Resistor R11 is included to provide a discharge path for charge on the gates of field-effect transistors Q1 and Q2 when the burden-reducing control signal on conductor V7 goes low.

The operation of input channel two with input current J7 is similar to input channel one with input current J2. Rectifying, burden-reducing, and current-sensing circuit 54 functions in a similar manner for input current J7 as the equivalent circuit (comprising field-effect transistors QI and Q2, diodes D5 and D6, photovoltaic isolator 30, and resistors R1, and R11) functions for input current J2. Any number of inputs may be configured in a similar way to provide rectified current to charge capacitors C5 and C6 and simultaneously sense input current. Of course, inputs could also be configured for current sensing only, similar to the configuration for input current J7 shown in FIGS. 2A, 4, 6, 7, 9, and 11.

Other parts of the configuration shown in FIG. 15 operate similar to previous configurations.

A single burden-reducing control conductor (V7) is shown in FIG. 15 to control the burden-reducing function for both input currents. The burden-reducing function could be separately controlled for each input current with separate signals from the microprocessor. Similarly, the burden-reducing function could be controlled separately or together for any number of inputs (if the microprocessor has an adequate number of outputs available for individual control).

FIGS. 16A and 16B show a flowchart that illustrates the operation of microprocessor 6 (see FIG. 1). The microprocessor automatically starts at the "power up" operation 31 when regulated d-c power at the terminals of the microprocessor is first sufficient for operation. Before proceeding, the charge state of the power supply is verified to be adequate as shown at operation 32. Adequate charge on power supply capacitor C1 is communicated to the microprocessor via conductor V8 (see FIGS. 1, 2A and 2B). The microprocessor waits until power supply charge is adequate before proceeding. This ensures adequate power to complete the next series of operations.

Once the power supply is adequately charged, the microprocessor checks system and data integrity as indicated by operation 33. These are standard diagnostic tests based on prior art.

Operation 34 sets variable N1 to the "input channel quantity," which is the number of input currents to be monitored (the circuits associated with each input current are each assigned an input channel number). This parameter may be modified by user input, and the microprocessor merely loads this value from nonvolatile memory.

Operation 35 resets various demand calculation parameters. This includes a demand interval timer, which is reset to zero.

Operation 36 sets loop control variable "N" to a value of 1. Variable N controls which input current (or "input channel") the current monitor is presently sensing and performing calculations on.

Operation 37 again checks the status of the power supply. This ensures adequate power to complete the next series of operations.

Operation 38 branches to a user input mode if a user interface pushbutton has been activated.

Operation 39 modifies various operational parameters as directed by user input. These include such items as the number of active input channels, and winding ratios of external current transformers. Historical data (such as maximum current demand) may be erased (or reset to zero) if so directed by user input.

Operation 40 again checks the status of the power supply. This ensures adequate power to complete the next series of operations.

Operation 41 displays various stored data as directed by user input. Special calculations not routinely performed by operation 44 may also be done here by user request.

At the end of the user input mode, the flowchart branches back to the beginning. Demand calculations are assumed to be corrupted by taking time for user input, so demand calculations are reinitialized.

If there is no user input as of operation 38, the microprocessor moves to operation 42. The burden-reducing circuit is actuated (except for the power supply and current-sensing configuration of FIG. 2A which has no burden-reducing circuit), and a series of waveform samples is obtained via the analog-to-digital converter circuit. Approximately 100 samples are taken at uniform time intervals to define a complete waveform. The burden-reducing circuit is then turned off.

Operation 43 again checks the status of the power supply. This ensures adequate power to complete the next series of operations.

Operation 44 involves numerous calculations to calculate various data for the waveform obtained by operation 42. These are standard calculations based on prior art. They may include such items as one-cycle peak current magnitude, average current magnitude, RMS current magnitude, crest factor, distortion factor, equivalent k-factor for harmonic-rated transformers, and calculation of harmonic frequency components. Some of these calculations (such as harmonic calculations) may be performed only by user request (as part of operation 41) to minimize the calculation time required for each loop.

Operation 45 again checks the status of the power supply. This ensures adequate power to complete the next series of operations.

Operation 46 displays calculation results, and saves appropriate data. This operation also transmits data to external equipment if applicable.

The current demand calculations require data over the entire demand calculation period (typically 15 or 30 minutes). Operation 47 updates this ongoing calculation with the latest one-cycle calculation results.

Operation 48 increases the loop counter by one so the current monitor will sense and perform calculations on the next (higher numbered) input channel when the loop is repeated.

Operation 49 checks to see if the loop counter is still at a valid input channel number. If "yes," the loop repeats and the next input channel is sensed and waveform calculations are performed. If "no," then operation 50 checks to see whether or not the demand timer has timed out. If "no," the flow branches back to operation 36 where the loop counter is reset to "one" so all input channels will be sensed and calculated again.

If operation 50 finds that the demand timer has timed out, then current demand calculations are completed for all input channels by operation 52 (after the charge on the power supply has been verified by operation 51).

Operation 53 saves appropriate current demand data to nonvolatile memory, displays demand data, and transmits demand data to remote equipment (if applicable). Then flow branches back to operation 35 where the demand calculations and demand interval timer are reset. The current monitor continues monitoring current indefinitely, continually updating maximum current demand data and displaying present data calculated for each input channel.

The flowchart shown in FIGS. 16A and 16B illustrates demand calculations for operation similar to an "integrated-demand" meter (as discussed under "Background of the Invention—Prior Art"). The current monitor may also be programmed to calculate demand like a "sliding window integrated-demand" meter, or in a way that simulates a "lagged-demand" meter. Of course, any other type of demand calculation method may also be used.

Conclusions, Ramifications, and Scope

The foregoing describes a self-powered current monitor for economically monitoring current in electric power systems. The unit requires no external power supply connections, and is capable of displaying information relating to current magnitude, current demand, and current distortion (harmonics).

Several possible embodiments of the self-powered current monitor have been described and illustrated. There are many other embodiments possible simply by taking different parts of different figures and combining them in different ways. All such combinations are intended to be considered part of this disclosure.

Also, there are many variations possible regarding the implementation of various subsystems described herein. For example, there are other kinds of semiconductor devices that could be utilized as electronic switches to accomplish the same functions as the silicon-controlled rectifiers and field-effect transistors discussed herein. The components and configurations utilized in this disclosure are intended to be illustrative only, and are not intended to limit the scope of the appended claims.

While only certain preferred features of the invention have been shown by way of illustration, many modifications and changes will occur to those skilled in the art. It is, therefore, to be understood that the appended claims are intended to cover all such modifications and changes as fall within the true spirit of the invention.

What is claimed is:

1. A self-powered current monitor for providing visual indication of characteristics of an electric current; said self-powered current monitor comprising:
   (a) a current-sensing means, connected in series with said electric current, providing an analog signal containing information about said characteristics;
   (b) an analog-to-digital converter means, connected to said current-sensing means, converting said analog signal into a digital signal;
   (c) a display means providing visual indication of said characteristics;
   (d) a memory means storing working data and program data;
   (e) a microprocessor means, connected to said analog-to-digital converter means and to said display means and to said memory means, receiving said digital signal, utilizing said program data and said working data to determine said characteristics, and providing output suitable for said display means;
   (f) a power supply means, connected in series with said electric current, deriving regulated d-c power from said electric current; and
   (g) a power-distributing means, connected to said power supply means and to said analog-to-digital converter means and to said display means and to said memory means and to said microprocessor means, distributing said regulated d-c power from said power supply means to said analog-to-digital converter means and to said display means and to said memory means and to said microprocessor means;

said electric current being generated by a current source; wherein said characteristics of said electric current comprise one or more of root-mean-square magnitude, average magnitude, peak magnitude, harmonic component magnitudes, distortion factor, form factor, crest factor, equivalent k-factor for transformers with harmonic rating, graphical representation of the waveform, current demand, and maximum current demand.

2. The self-powered current monitor of claim 1 wherein said current-sensing means comprises a resistor connected in series with said electric current thereby producing said analog signal which is a voltage signal across said resistor proportional to said electric current; said power supply means comprises:
   (a) an internal transformer having a primary winding connected in series with said electric current, and a secondary winding magnetically coupled to the primary winding by a suitable magnetic core thereby inducing an alternating current in said secondary winding;
   (b) a rectifying means, connected to said secondary winding, producing direct current from said alternating current;
   (c) a charge-storing means, connected to said rectifying means, providing an unregulated d-c voltage from said direct current;
   (d) a voltage-regulating means, connected to said charge-storing means, producing said regulated d-c power from said unregulated d-c voltage; and
   (e) a voltage-limiting means, connected in such a way as to shunt excess current from said secondary winding away from said charge-storing means thereby limiting said unregulated d-c voltage to a predetermined value, said voltage-limiting means comprising one or more electronic switch means and suitable control means, said suitable control means sensing said unregulated d-c voltage and actuating said electronic switch means whenever said unregulated d-c voltage exceeds a predetermined value;

said electric current being an alternating electric current.

3. The self-powered current monitor of claim 1 further including a burden-reducing means to temporarily reduce the burden effect that said power supply means may have on said current source while said analog-to-digital converter means is sampling said analog signal; said burden-reducing means being connected to said power supply means with a control signal connection to said microprocessor means; said power supply means utilizing stored energy to maintain regulated power output while said burden-reducing means is actuated; said microprocessor means further controlling the time periods that said burden-reducing means is actuated.

4. The self-powered current monitor of claim 3 wherein said current-sensing means comprises a resistor connected in series with said electric current thereby producing said analog signal which is a voltage signal across said resistor proportional to said electric current; said power supply means comprises:
   (a) an internal transformer having a primary winding connected in series with said electric current, and a secondary winding magnetically coupled to the primary winding by a suitable magnetic core thereby inducing an alternating current in said secondary winding;
   (b) a rectifying means, connected to said secondary winding, producing direct current from said alternating current;
   (c) a charge-storing means, connected to said rectifying means, providing an unregulated d-c voltage from said direct current and acting as an energy storage device;
   (d) a voltage-regulating means, connected to said charge-storing means, producing said regulated d-c power from said unregulated d-c voltage; and
   (e) a voltage-limiting means, connected in such a way as to shunt excess current from said secondary winding away from said charge-storing means thereby limiting said unregulated d-c voltage to a predetermined value, said voltage-limiting means comprising one or more electronic switch means and suitable control means, said suitable control means sensing said unregulated d-c voltage and actuating said electronic switch means whenever said unregulated d-c voltage exceeds a predetermined value;

and said burden-reducing means comprises one or more electronic switch means connected in such a way as to temporarily shunt current from said secondary winding away from said charge-storing means when so actuated by said microprocessor means; said electric current being an alternating electric current; said voltage-regulating means utilizing energy stored in said charge storing means to produce said regulated d-c power while said burden-reducing means is actuated.

5. The self-powered current monitor of claim 3 wherein said current-sensing means comprises a resistor connected in series with said electric current thereby producing said analog signal which is a voltage signal across said resistor proportional to said electric current; said power supply means comprises:
   (a) a rectifying means, converting said electric current to direct current;
   (b) a charge-storing means, connected to said rectifying means, providing an unregulated d-c voltage from said direct current and acting as an energy storage device;

(c) a voltage-regulating means, connected to said charge-storing means, producing said regulated d-c power from said unregulated d-c voltage; and (d) a voltage-limiting means, connected in such a way as to shunt excess of said electric current away from said charge-storing means thereby limiting said unregulated d-c voltage to a predetermined value, said voltage-limiting means comprising one or more electronic switch means and suitable control means, said suitable control means sensing said unregulated d-c voltage and actuating said electronic switch means whenever said unregulated d-c voltage exceeds a predetermined value; and said burden-reducing means comprises one or more electronic switch means connected to said rectifying means and to said resistor in such a way as to temporarily switch said electric current away from said charge-storing means and through said resistor when so actuated by said microprocessor means; said voltage-regulating means utilizing energy stored in said charge-storing means to produce said regulated d-c power while said burden-reducing means is actuated; said resistor being connected in series with said electric current only while said burden-reducing means is actuated.

6. The self-powered current monitor of claim 3 wherein said current-sensing means comprises a resistor connected in series with said electric current thereby producing said analog signal which is a voltage signal across said resistor proportional to said electric current; said power supply means comprises:

(a) a rectifying means, converting said electric current to direct current;

(b) a charge-storing means, connected to said rectifying means, providing an unregulated d-c voltage from said direct current and acting as an energy storage device;

(c) a voltage-regulating means, connected to said charge-storing means, producing said regulated d-c power from said unregulated d-c voltage; and (d) a voltage-limiting means, connected in such a way as to shunt excess of said electric current away from said charge-storing means thereby limiting said unregulated d-c voltage to a predetermined value, said voltage-limiting means comprising one or more electronic switch means and suitable control means, said suitable control means sensing said unregulated d-c voltage and actuating said electronic switch means whenever said unregulated d-c voltage exceeds a predetermined value; and said burden-reducing means comprises one or more electronic switch means connected to said power supply means in such a way as to temporarily shunt said electric current away from said charge-storing means when so actuated by said microprocessor means; said voltage-regulating means utilizing energy stored in said charge-storing means to produce said regulated d-c power while said burden-reducing means is actuated.

7. The self-powered current monitor of claim 1 further including an amplifier means, connected to said current-sensing means and to said analog-to-digital converter means and to said power-distributing means, amplifying said analog signal prior to input to said analog-to-digital converter means.

8. The self-powered current monitor of claim 1 further including a user interface means, connected to said microprocessor means, enabling user input to said microprocessor means to modify how data is displayed and to set operational parameters; said microprocessor means further operating to receive user input from said user interface means.

9. The self-powered current monitor of claim 1 further including an interface means, connected to said microprocessor means and to said power-distributing means, communicating data to other equipment; said microprocessor means further providing data to said interface means for communication to other equipment.

10. The self-powered current monitor of claim 1 further including means for monitoring a plurality of said electric current comprising a plurality of said current-sensing means each connected in series with one of said plurality of said electric current thereby producing a plurality of said analog signal each containing information about one of said plurality of said electric current; said analog-to-digital converter means having a plurality of inputs corresponding to the number of said plurality of said electric current; said plurality of said current-sensing means being connected to said analog-to-digital converter means.

11. The self-powered current monitor of claim 10 wherein said power supply means further includes means for deriving said regulated d-c power from any or all of said plurality of said electric current; said means for deriving said regulated d-c power being connected in series with each of said plurality of said electric current.

12. A self-powered current monitor for communicating characteristics of an electric current; said self-powered current monitor comprising:

(a) a current-sensing means, connected in series with said electric current, providing an analog signal containing information about said characteristics;

(b) an analog-to-digital converter means, connected to said current-sensing means, converting said analog signal into a digital signal;

(c) an interface means communicating said characteristics to other equipment;

(d) a memory means storing working data and program data;

(e) a microprocessor means, connected to said analog-to-digital converter means and to said interface means and to said memory means, receiving said digital signal, utilizing said program data and said working data to determine said characteristics, and providing output suitable for said interface means;

(f) a power supply means, connected in series with said electric current, deriving regulated d-c power from said electric current; and (g) a power-distributing means, connected to said power supply means and to said analog-to-digital converter means and to said interface means and to said memory means and to said microprocessor means, distributing said regulated d-c power from said power supply means to said analog-to-digital converter means and to said interface means and to said memory means and to said microprocessor means;

said electric current being generated by a current source; wherein said characteristics of said electric current comprise one or more of root-mean-square magnitude, average magnitude, peak magnitude, harmonic component magnitudes, distortion factor, form factor, crest factor, equivalent k-factor for transformers with harmonic rating, graphical representation of the waveform, current demand, and maximum current demand.

13. The self-powered current monitor of claim 12 wherein said current-sensing means comprises a resistor connected in series with said electric current thereby producing said analog signal which is a voltage signal across said resistor proportional to said electric current; said power supply means comprises:

(a) an internal transformer having a primary winding connected in series with said electric current, and a secondary winding magnetically coupled to the primary winding by a suitable magnetic core thereby inducing an alternating current in said secondary winding;

(b) a rectifying means, connected to said secondary winding, producing direct current from said alternating current;

(c) a charge-storing means, connected to said rectifying means, providing an unregulated d-c voltage from said direct current;

(d) a voltage-regulating means, connected to said charge-storing means, producing said regulated d-c power from said unregulated d-c voltage; and (e) a voltage-limiting means, connected in such a way as to shunt excess current from said secondary winding away from said charge-storing means thereby limiting said unregulated d-c voltage to a predetermined value, said voltage-limiting means comprising one or more electronic switch means and suitable control means, said suitable control means sensing said unregulated d-c voltage and actuating said electronic switch means whenever said unregulated d-c voltage exceeds a predetermined value;

said electric current being an alternating electric current.

14. The self-powered current monitor of claim 12 further including a burden-reducing means to temporarily reduce the burden effect that said power supply means may have on said current source while said analog-to-digital converter means is sampling said analog signal; said burden-reducing means being connected to said power supply means with a control signal connection to said microprocessor means; said power supply means utilizing stored energy to maintain regulated power output while said burden-reducing means is actuated; said microprocessor means further controlling the time periods that said burden-reducing means is actuated.

15. The self-powered current monitor of claim 14 wherein said current-sensing means comprises a resistor connected in series with said electric current thereby producing said analog signal which is a voltage signal across said resistor proportional to said electric current; said power supply means comprises:

(a) an internal transformer having a primary winding connected in series with said electric current, and a secondary winding magnetically coupled to the primary winding by a suitable magnetic core thereby inducing an alternating current in said secondary winding;

(b) a rectifying means, connected to said secondary winding, producing direct current from said alternating current;

(c) a charge-storing means, connected to said rectifying means, providing an unregulated d-c voltage from said direct current and acting as an energy storage device;

(d) a voltage-regulating means, connected to said charge-storing means, producing said regulated d-c power from said unregulated d-c voltage; and (e) a voltage-limiting means, connected in such a way as to shunt excess current from said secondary winding away from said charge-storing means thereby limiting said unregulated d-c voltage to a predetermined value, said voltage-limiting means comprising one or more electronic switch means and suitable control means, said suitable control means sensing said unregulated d-c voltage and actuating said electronic switch means whenever said unregulated d-c voltage exceeds a predetermined value;

and said burden-reducing means comprises one or more electronic switch means connected in such a way as to temporarily shunt current from said secondary winding away from said charge-storing means when so actuated by said microprocessor means; said electric current being an alternating electric current; said voltage-regulating means utilizing energy stored in said charge-storing means to produce said regulated d-c power while said burden-reducing means is actuated.

16. The self-powered current monitor of claim 14 wherein said current-sensing means comprises a resistor connected in series with said electric current thereby producing said analog signal which is a voltage signal across said resistor proportional to said electric current; said power supply means comprises:

(a) a rectifying means, converting said electric current to direct current;

(b) a charge-storing means, connected to said rectifying means, providing an unregulated d-c voltage from said direct current and acting as an energy storage device;

(c) a voltage-regulating means, connected to said charge-storing means, producing said regulated d-c power from said unregulated d-c voltage; and (d) a voltage-limiting means, connected in such a way as to shunt excess of said electric current away from said charge-storing means thereby limiting said unregulated d-c voltage to a predetermined value, said voltage-limiting means comprising one or more electronic switch means and suitable control means, said suitable control means sensing said unregulated d-c voltage and actuating said electronic switch means whenever said unregulated d-c voltage exceeds a predetermined value;

and said burden-reducing means comprises one or more electronic switch means connected to said rectifying means and to said resistor in such a way as to temporarily switch said electric current away from said charge-storing means and through said resistor when so actuated by said microprocessor means; said voltage-regulating means utilizing energy stored in said charge-storing means to produce said regulated d-c power while said burden-reducing means is actuated; said resistor being connected in series with said electric current only while said burden-reducing means is actuated.

17. The self-powered current monitor of claim 14 wherein said current-sensing means comprises a resistor connected in series with said electric current thereby producing said analog signal which is a voltage signal across said resistor proportional to said electric current; said power supply means comprises:

(a) a rectifying means, converting said electric current to direct current;

(b) a charge-storing means, connected to said rectifying means, providing an unregulated d-c voltage from said direct current and acting as an energy storage device;

(c) a voltage-regulating means, connected to said charge-storing means, producing said regulated d-c power from said unregulated d-c voltage; and (d) a voltage-limiting means, connected in such a way as to shunt excess of said electric current away from said charge-storing means thereby limiting said unregulated d-c voltage to a predetermined value, said voltage-limiting means comprising one or more electronic switch means and suitable control means, said suitable control means sensing said unregulated d-c voltage and actuating said electronic switch means whenever said unregulated d-c voltage exceeds a predetermined value; and said burden-reducing means comprises one or more electronic switch means connected to said power supply means in such a way as to temporarily shunt said electric current away from said charge-storing means when so actuated by said microprocessor means; said voltage-regulating means utilizing energy stored in said charge-storing means to produce said regulated d-c power while said burden-reducing means is actuated.

18. The self-powered current monitor of claim 12 further including an amplifier means, connected to said current-sensing means and to said analog-to-digital converter means and to said power-distributing means, amplifying said analog signal prior to input to said analog-to-digital converter means.

19. The self-powered current monitor of claim 12 further including a user interface means, connected to said microprocessor means, enabling user input to said microprocessor means to modify how data is communicated and to set operational parameters; said microprocessor means further operating to receive user input from said user interface means.

20. The self-powered current monitor of claim 12 wherein said interface means communicates to said other equipment via electrical signals conducted by metallic conductors connected between said interface means and said other equipment.

21. The self-powered current monitor of claim 12 wherein said interface means communicates to said other equipment via electromagnetic radiation traveling through air between said interface means and said other equipment.

22. The self-powered current monitor of claim 12 wherein said interface means communicates to said other equipment via light waves traveling in optical fiber connected between said interface means and said other equipment.

23. The self-powered current monitor of claim 12 further including means for monitoring a plurality of said electric current comprising a plurality of said current-sensing means each connected in series with one of said plurality of said electric current thereby producing a plurality of said analog signal each containing information about one of said plurality of said electric current; said analog-to-digital converter means having a plurality of inputs corresponding to the number of said plurality of said electric current; said plurality of said current-sensing means being connected to said analog-to-digital converter means.

24. The self-powered current monitor of claim 23 wherein said power supply means further includes means for deriving said regulated d-c power from any or all of said plurality of said electric current; said means for deriving said regulated d-c power being connected in series with each of said plurality of said electric current.

25. In combination:
(a) a power supply means receiving an electric current from a current source and providing a regulated d-c power output derived from said electric current;
(b) a current-sensing means, connected to said power supply means, providing an analog signal containing information about said electric current; and
(c) a burden-reducing means, connected to said power supply means;

said current source being adversely affected by the normal burden effect of said power supply means; said burden-reducing means acting to temporarily reduce the burden effect that said power supply means has on said current source while said burden-reducing means is actuated; said power supply means utilizing stored energy to maintain said regulated d-c power output while said burden-reducing means is actuated.

26. The combination of claim 25, wherein said current-sensing means comprises a resistor connected in series with said electric current thereby producing said analog signal which is a voltage signal across said resistor proportional to said electric current.

27. The combination of claim 26, wherein said power supply means comprises:
(a) an internal transformer having a primary winding connected in series with said electric current, and a secondary winding magnetically coupled to the primary winding by a suitable magnetic core thereby inducing an alternating current in said secondary winding;
(b) a rectifying means, connected to said secondary winding, producing direct current from said alternating current;
(c) a charge-storing means, connected to said rectifying means, providing an unregulated d-c voltage from said direct current and acting as an energy storage device;
(d) a voltage-regulating means, connected to said charge-storing means, producing said regulated d-c power output from said unregulated d-c voltage; and
(e) a voltage-limiting means, connected in such a way as to shunt excess current from said secondary winding away from said charge-storing means thereby limiting said unregulated d-c voltage to a predetermined value, said voltage-limiting means comprising one or more electronic switch means and suitable control means, said suitable control means sensing said unregulated d-c voltage and actuating said electronic switch means whenever said unregulated d-c voltage exceeds a predetermined value;

and said burden-reducing means comprises one or more electronic switch means connected in such a way as to temporarily shunt current from said secondary winding away from said charge-storing means when so actuated by external controls; said electric current being an alternating electric current; said voltage-regulating means utilizing energy stored in said charge-storing means to produce said regulated d-c power output while said burden-reducing means is actuated.

28. The combination of claim 27 further receiving a plurality of said electric current and further including a plurality of said resistor, a plurality of said internal transformer, a plurality of said rectifying means, a plurality of said voltage-limiting means, and a plurality of said burden-reducing means; each of these plural components being connected in a similar manner as in claim 27 to provide rectified current to said charge-storing means from each of said plurality of said electric current and provide a plurality of said voltage signal each proportional to one of said plurality of said electric current; each of said plurality of said voltage-limiting means being connected to the secondary winding of one of said plurality of internal transformer; each of said plurality of said burden-reducing means being connected to the secondary winding of one of said plurality of internal transformer.

29. The combination of claim 27 further receiving a plurality of said electric current and further including a plurality of said resistor, a plurality of said internal transformer, and a plurality of said rectifying means; each of these plural components being connected in a similar manner as in claim 27 to provide rectified current to said charge-storing means from each of said plurality of said electric current and provide a plurality of said voltage signal each proportional to one of said plurality of said electric current; said voltage-limiting means acting to shunt excess current from the secondary windings of all of said plurality of said internal transformer away from said charge-storing means; said burden-reducing means acting to temporarily shunt current from the secondary windings of all of said plurality of said internal transformer away from said charge-storing means when so actuated by external controls.

30. The combination of claim 26, wherein said power supply means comprises:
 (a) a rectifying means, converting said electric current to direct current;
 (b) a charge-storing means, connected to said rectifying means, providing an unregulated d-c voltage from said direct current and acting as an energy storage device;
 (c) a voltage-regulating means, connected to said charge-storing means, producing said regulated d-c power output from said unregulated d-c voltage; and
 (d) a voltage-limiting means, connected in such a way as to shunt excess of said electric current away from said charge-storing means when actuated by suitable control means, said voltage-limiting means comprising one or more electronic switch means and suitable control means, said suitable control means sensing said unregulated d-c voltage and actuating said electronic switch means whenever said unregulated d-c voltage exceeds a predetermined value;
and said burden-reducing means comprises one or more electronic switch means connected in such a way as to temporarily shunt said electric current away from said charge-storing means when so actuated by external controls; said voltage-regulating means utilizing energy stored in said charge-storing means to produce said regulated d-c power while said burden-reducing means is actuated.

31. The combination of claim 30 further receiving a plurality of said electric current and further including a plurality of said resistor, a plurality of said rectifying means, a plurality of said voltage-limiting means, and a plurality of said burden-reducing means; each of these plural components being connected in a similar manner as in claim 30 to provide direct current to said charge-storing means from each of said plurality of said electric current and to provide a plurality of said voltage signal each proportional to one of said plurality of said electric current.

32. The combination of claim 25, wherein said analog signal contains information about said electric current only when said burden-reducing means is actuated; said current-sensing means comprising a resistor temporarily connected in series with said electric current thereby producing said analog signal which is a voltage signal across said resistor proportional to said electric current; said resistor being connected in series with said electric current whenever said burden-reducing means is actuated.

33. The combination of claim 32 wherein said power supply means comprises:
 (a) a rectifying means, converting said electric current to direct current;
 (b) a charge-storing means, connected to said rectifying means, providing an unregulated d-c voltage from said direct current and acting as an energy storage device;
 (c) a voltage-regulating means, connected to said charge-storing means, producing said regulated d-c power output from said unregulated d-c voltage; and
 (d) a voltage-limiting means, connected in such a way as to shunt excess of said electric current away from said charge-storing means when actuated by suitable control means, said voltage-limiting means comprising one or more electronic switch means and suitable control means, said suitable control means sensing said unregulated d-c voltage and actuating said electronic switch means whenever said unregulated d-c voltage exceeds a predetermined value;
and said burden-reducing means comprises one or more electronic switch means connected to said rectifying means and to said resistor in such a way as to temporarily switch said electric current away from said charge-storing means and through said resistor when so actuated by external controls; said voltage-regulating means utilizing energy stored in said charge-storing means to produce said regulated d-c power while said burden-reducing means is actuated.

34. The combination of claim 33 further receiving a plurality of said electric current and further including a plurality of said resistor, a plurality of said rectifying means, a plurality of said voltage-limiting means, and a plurality of said burden-reducing means; each of these plural components being connected in a similar manner as in claim 33 to provide direct current to said charge-storing means from each of said plurality of said electric current and to provide a plurality of said voltage signal each proportional to one of said plurality of said electric current.

35. In combination:
 (a) a power supply means receiving a plurality of electric currents from a plurality of current sources and providing a regulated d-c power output derived from said plurality of electric currents; and
 (b) a plurality of current-sensing means, connected to said power supply means, providing a plurality of analog signals each containing information about characteristics of one of said plurality of electric currents;
wherein each of said plurality of current-sensing means comprises a resistor connected in series with one of said plurality of electric currents thereby producing one of said plurality of analog signals which is a voltage signal across said resistor proportional to said electric current; wherein said characteristics of said electric currents comprise one or more of root-mean-square magnitude, average magnitude, peak magnitude, harmonic component magnitudes, distortion factor, form factor, crest factor, equivalent k-factor for transformers with harmonic rating, graphical representation of the waveform, current demand, and maximum current demand.

36. The combination of claim 35, wherein said power supply means comprises:
 (a) a plurality of internal transformers, each having a primary winding connected in series with one of said plurality of electric currents, and each having a secondary winding magnetically coupled to the primary winding by a suitable magnetic core thereby inducing an alternating current in said secondary winding;
 (b) a plurality of rectifying means, each connected to the secondary winding of one of said plurality of internal transformers, each producing direct current from said alternating current;
 (c) a charge-storing means, connected to said plurality of rectifying means, providing an unregulated d-c voltage from said direct current;
 (d) a voltage-regulating means, connected to said charge-storing means, producing said regulated d-c power output from said unregulated d-c voltage; and
 (e) a plurality of voltage-limiting means, each connected to the secondary winding of one of said plurality of internal transformers, shunting excess current from said secondary winding away from said charge-storing means thereby limiting said unregulated d-c voltage to a predetermined value, each of said plurality of voltage-limiting means comprising one or more electronic switch means and suitable control means, said suitable control means sensing said unregulated d-c voltage and actuating said electronic switch means whenever said unregulated d-c voltage exceeds a predetermined value; each of said plurality of electric currents being alternating electric currents.

37. The combination of claim 36 wherein said power supply means further includes a plurality of burden-reducing means, each connected to the secondary winding of one of said plurality of internal transformers, each comprising one or more electronic switch means connected in such a way as to temporarily shunt current from the secondary winding of one of said plurality of internal transformers away from said charge-storing means when so actuated by external controls; said voltage-regulating means utilizing energy stored in said charge-storing means to produce said regulated d-c power output while said burden-reducing means is actuated; each of said plurality of current sources being adversely affected by the normal burden effect of said power supply means; each of said plurality of burden-reducing means acting to temporarily reduce the burden effect that said power supply means has on one of said plurality of current sources.

38. The combination of claim 35, wherein said power supply means comprises:

(a) a plurality of internal transformers, each having a primary winding connected in series with one of said plurality of electric currents, and each having a secondary winding magnetically coupled to the primary winding by a suitable magnetic core thereby inducing an alternating current in said secondary winding, (b) a plurality of rectifying means, each connected to the secondary winding of one of said plurality of internal transformers, each producing direct current from said alternating current;

(c) a charge-storing means, connected to said plurality of rectifying means, providing an unregulated d-c voltage from said direct current;

(d) a voltage-regulating means, connected to said charge-storing means, producing said regulated d-c power output from said unregulated d-c voltage; and (e) a voltage-limiting means, connected in such a way as to shunt excess of said direct current away from said charge-storing means thereby limiting said unregulated d-c voltage to a predetermined value, said voltage-limiting means comprising one or more electronic switch means and suitable control means, said suitable control means sensing said unregulated d-c voltage and actuating said electronic switch means whenever said unregulated d-c voltage exceeds a predetermined value;

each of said plurality of electric currents being alternating electric currents.

39. The combination of claim 38 wherein said power supply means further includes a burden-reducing means comprising one or more electronic switch means connected in such a way as to temporarily shunt said direct current away from said charge-storing means when so actuated by external controls; said voltage-regulating means utilizing energy stored in said charge-storing means to produce said regulated d-c power output while said burden-reducing means is actuated; each of said plurality of current sources being adversely affected by the normal burden effect of said power supply means; said burden-reducing means acting to temporarily reduce the burden effect that said power supply means has on said plurality of current sources while said burden-reducing means is actuated.

40. The combination of claim 35, wherein said power supply means comprises:

(a) a plurality of rectifying means, each receiving one of said plurality of electric currents, each producing direct current;

(b) a charge-storing means, connected to said plurality of rectifying means, providing an unregulated d-c voltage from said direct current;

(c) a voltage-regulating means, connected to said charge-storing means, producing said regulated d-c power output from said unregulated d-c voltage; and (d) a plurality of voltage-limiting means, each connected in such a way as to shunt excess of one of said plurality of electric currents away from said charge-storing means thereby limiting said unregulated d-c voltage to a predetermined value, each of said plurality of voltage-limiting means comprising one or more electronic switch means and suitable control means, said suitable control means sensing said unregulated d-c voltage and actuating said electronic switch means whenever said unregulated d-c voltage exceeds a predetermined value.

41. The combination of claim 40 wherein said power supply means further includes a plurality of burden-reducing means, each comprising one or more electronic switch means connected in such a way as to temporarily shunt one of said plurality of electric currents away from said charge-storing means when so actuated by external controls; said voltage-regulating means utilizing energy stored in said charge-storing means to produce said regulated d-c power output while said burden-reducing means is actuated; each of said plurality of current sources being adversely affected by the normal burden effect of said power supply means; each of said plurality of burden-reducing means acting to temporarily reduce the burden effect that said power supply means has on one of said plurality of current sources.

* * * * *

UNITED STATES PATENT AND TRADEMARK OFFICE
CERTIFICATE OF CORRECTION

PATENT NO : 6,018,700
DATED : January 25, 2000
INVENTOR(S): Thomas G. Edel

It is certified that error appears in the above-identified patent and that said Letters Patent are hereby corrected as shown below:

Column 1, line 49, delete "ANSIINFPA" and substitute therefor --ANSI/NFPA--.

Column 4, line 31, delete "modem" and substitute therefor --modern--.

Column 8, line 16, delete "cur-rent" and substitute therefor --current--.

Column 10, line 61, delete "GND".

Column 10, line 62, Insert --GND-- at beginning of line (in front of "Connection")

Column 10, line 63, delete "31" and substitute therefor --J1--.

Column 19, line 23, delete "TS" and substitute therefor --T5--.

Column 20, line 7, delete "DS" and substitute therefor --D5--.

Column 21, line 32, delete "TS" and substitute therefor --T5--.

Column 22, line 38, delete "81" and substitute therefor --8I--.

Signed and Sealed this

Seventeenth Day of October, 2000

*Attest:*

Q. TODD DICKINSON

*Attesting Officer*  *Director of Patents and Trademarks*